US006805779B2

(12) United States Patent
Chistyakov

(10) Patent No.: US 6,805,779 B2
(45) Date of Patent: Oct. 19, 2004

(54) PLASMA GENERATION USING MULTI-STEP IONIZATION

(75) Inventor: Roman Chistyakov, Andover, MA (US)

(73) Assignee: Zond, Inc., Mansfield, MA (US)

(*) Notice: Subject to any disclaimer, the term of this patent is extended or adjusted under 35 U.S.C. 154(b) by 0 days.

(21) Appl. No.: 10/249,202

(22) Filed: Mar. 21, 2003

(65) Prior Publication Data

US 2004/0182702 A1 Sep. 23, 2004

(51) Int. Cl.[7] .......................... C23C 14/00; C23C 16/00; H01J 7/24
(52) U.S. Cl. ............................ 204/298.36; 204/298.37; 204/298.38; 118/723 VE; 118/723 R; 315/111.81; 315/111.91
(58) Field of Search .................. 315/111.81, 111.91, 315/111.71, 111.41, 111.21; 204/298.37, 298.38, 298.36; 118/723 VE, 723 R, 723 EB, 723 E; 250/28, 283, 377, 423, 435, 489

(56) References Cited

U.S. PATENT DOCUMENTS

| | | | |
|---|---|---|---|
| 3,619,605 A | 11/1971 | Cook et al. ................. 250/41.9 |
| 4,060,708 A | 11/1977 | Walters ....................... 219/121 |
| 4,148,612 A | 4/1979 | Taylor et al. ................... 23/232 |
| 4,546,253 A | 10/1985 | Tsuchiya et al. ............. 250/288 |
| 4,703,222 A | 10/1987 | Yoshikawa et al. ...... 313/362.1 |
| 4,792,725 A | 12/1988 | Levy et al. .................... 315/39 |
| 4,802,183 A | 1/1989 | Harris et al. .................. 372/57 |
| 4,919,690 A | 4/1990 | Lovelock .......................... 55/2 |
| 4,953,174 A | 8/1990 | Eldridge et al. .............. 372/87 |
| 5,015,493 A | 5/1991 | Gruen .......................... 427/38 |
| 5,083,061 A | 1/1992 | Koshiishi et al. ....... 315/111.81 |
| 5,247,531 A | 9/1993 | Muller-Horsche ............ 372/38 |
| 5,247,535 A | 9/1993 | Muller-Horsche et al. .... 372/86 |
| 5,286,360 A | 2/1994 | Szczyrbowski et al. ...................... 204/298.08 |
| 5,382,457 A | 1/1995 | Coombe ...................... 427/596 |
| 5,506,405 A | 4/1996 | Yoshida et al. ............. 250/251 |
| 5,733,418 A | 3/1998 | Hershcovitch et al. . 204/192.11 |
| 5,821,548 A | 10/1998 | Hinchliffe .............. 250/492.21 |
| 6,057,244 A | 5/2000 | Hausmann et al. ......... 438/706 |

(List continued on next page.)

FOREIGN PATENT DOCUMENTS

| WO | WO 98/40532 | 9/1998 |
|---|---|---|
| WO | WO 01/98553 A1 | 12/2001 |

OTHER PUBLICATIONS

Booth, et al., The Transition From Symmetric To Asymemtric Discharges In Pulsed 13.56 MHz Capacitively Coupled Plasmas, J. Appl. Phys., Jul. 15, 1997, pp. 552–560, vol. 82, No. 2, American Institute of Physics.

Bunshah, et al., Deposition Technologies For Films And Coatings, pp. 178–183, Noyes Publications, Park Ridge, New Jersey.

Daugherty, et al., Attachment–Dominated Electron–Beam–Ionized Discharges, Applied Physics Letters, May 15, 1976, pp. 581–583, vol. 28, No. 10, American Institue of Physics.

(List continued on next page.)

Primary Examiner—Tuyet T. Vo
(74) Attorney, Agent, or Firm—Kurt Rauschenbach; Rauschenbach Patent Law Group, LLC

(57) ABSTRACT

The present invention relates to a plasma generator that generates a plasma with a multi-step ionization process. The plasma generator includes an excited atom source that generates excited atoms from ground state atoms supplied by a feed gas source. A plasma chamber confines a volume of excited atoms generated by the excited atom source. An energy source is coupled to the volume of excited atoms confined by the plasma chamber. The energy source raises an energy of excited atoms in the volume of excited atoms so that at least a portion of the excited atoms in the volume of excited atoms is ionized, thereby generating a plasma with a multi-step ionization process.

46 Claims, 13 Drawing Sheets-

U.S. PATENT DOCUMENTS

| | | | |
|---|---|---|---|
| 6,124,675 A | 9/2000 | Bertrand et al. | 315/111.91 |
| 6,207,951 B1 | 3/2001 | Yamauchi et al. | 250/251 |
| 6,296,742 B1 | 10/2001 | Kouznetsov | 204/192.12 |
| 6,311,638 B1 * | 11/2001 | Ishii et al. | 118/723 MW |
| 6,395,641 B2 | 5/2002 | Savas | 438/714 |
| 6,413,382 B1 | 7/2002 | Wang et al. | 204/192.12 |
| 6,413,383 B1 | 7/2002 | Chiang et al. | 204/192.13 |
| 6,661,178 B1 * | 12/2003 | Bertrand et al. | 315/111.91 |
| 2002/0153103 A1 | 10/2002 | Madocks | 156/345.46 |

OTHER PUBLICATIONS

Goto, et al., Dual Excitation Reactive Ion Etcher For Low Energy Plasma Processing, J. Vac. Sci. Technol. A., Sep/Oct 1992, pp. 3048–3054, vol. 10, No. 5, American Vacuum Society.

Kouznetsov, et al., A Novel Pulsed Magnetron Sputter Technique Utilizing Very High Target Power Densities, Surface and Coatings Technology, 1999, pp. 290–293, vol. 122, Elsevier Science S.A.

Lindquist, et al., High Selectivity Plasma Etching Of Silicone Dioxide With A Dual Frequency 27/2 MHz Capacitive RF Discharge.

Macak, Reactive Sputter Deposition Process Of Al2O3 And Characterization Of A Novel High Plasma Density Pulsed Magnetron Discharge, Linkoping Studies In Science And Technology, pp. 1–2.

Macak, et al., Ionized Sputter Deposition Using An Extremely High Plasma Density Pulsed Magnetron Discharge, J. Vac. Sci. Technol. A., Jul/Aug 2000, pp. 1533–1537, vol. 18, No. 4., American Vacuum Society.

Mozgrin, et al., High–Current Low–Pressure Quasi–Stationary Discharge In A Magnetic Field: Experimental Research, Plasma Physics Reports, 1995, pp. 400–409, vol. 21, No. 5.

Rossnagel, et al., Induced Drift Currents In Circular Planar Magnetrons, J. Vac. Sci. Technol. A., Jan/Feb 1987, pp. 88–91, vol. 5, No. 1, American Vacuum Society.

Sheridan, et al., Electron Velocity Distribution Functions In A Sputtering Magnetron Discharge For The E x B Direction, J. Vac. Sci. Technol. A., Jul/Aug 1998, pp. 2173–2176, vol. 16, No. 4, American Vacuum Society.

Steinbruchel, A Simple Formula For Low–Energy Sputtering Yields, Appl. Phys. A., 1985, pp. 37–42, vol. 36, Sprigner Verlag.

Encyclopedia Of Low Temperature Plasma, p. 119, vol. 3.

Encyclopedia Of Low Temperature Plasma, p. 123, vol. 3.

Lymberopoulos, et al., Fluid Simulations Of Glow Discharges: Effect Of Metastable Atoms In Argon, J. Appl. Phys., Apr. 1993, pp. 3668–3679, vol. 73, No. 8, American Institute of Physics.

Burnham, et al., Efficient Electric Discharge Lasers In XeF and KrF, Applied Physics Letters, Jul. 1976, pp. 30–32, vol. 29, No. 1, American Institute of Physics.

Fabrikant, et al., Electron Impact Formation Of Metastable Atoms, pp. 3, 31, 34–37, Amsterdam.

Fahey, et al., High Flux Beam Source Of Thermal Rare–Gas Metastable Atoms, 1980, J. Phys. E. Sci. Instrum., vol. 13, The Institute of Physics.

Verheijen, et al., A Discharge Excited Supersonic Source Of Metastable Rare Gas Atoms, J.Phys. E. Sci. Instrum, 1984, vol. 17.

Eletskii, Excimer Lasers, Sov. Phys. Usp., Jun. 1978, pp. 502–521, vol. 21, No. 6.

Chistyakov, High Power Pulsed Magnetron Sputtering, Application No.: 10/065, 277, Filed: Sep. 30, 2002.

Chistyakov, High–Power Pulsed Magnetically Enhanced Plasma Processing, Application No.: 10/065, 551, Filed: Oct. 29, 2002.

Chistyakov, Method and Apparatus For Generating High–Density Plasma, Application No.: 10/065, 629, Filed: Nov. 4, 2002.

Chistyakov, High Deposition Rate Sputtering, Application No.: 10/065, 739, Filed: Nov. 14, 2002.

* cited by examiner

PLASMA GENERATION USING MULTI-STEP IONIZATION

BACKGROUND OF THE INVENTION

Plasma is considered the fourth state of matter. A plasma is a collection of charged particles that move in random directions. A plasma is, on average, electrically neutral. One method of generating a plasma is to drive a current through a low-pressure gas between two conducting electrodes that are positioned parallel to each other. Once certain parameters are met, the gas "breaks down" to form the plasma. For example, a plasma can be generated by applying a potential of several kilovolts between two parallel conducting electrodes in an inert gas atmosphere (e.g., argon) at a pressure that is between about $10^{-1}$ and $10^{-2}$ Torr.

Plasma processes are widely used in many industries, such as the semiconductor manufacturing industry. For example, plasma etching is commonly used to etch substrate material and films deposited on substrates in the electronics industry. There are four basic types of plasma etching processes that are used to remove material from surfaces: sputter etching, pure chemical etching, ion energy driven etching, and ion inhibitor etching.

Plasma sputtering is a technique that is widely used for depositing films on substrates and other work pieces. Sputtering is the physical ejection of atoms from a target surface and is sometimes referred to as physical vapor deposition (PVD). Ions, such as argon ions, are generated and are then drawn out of the plasma and accelerated across a cathode dark space. The target surface has a lower potential than the region in which the plasma is formed. Therefore, the target surface attracts positive ions.

Positive ions move towards the target with a high velocity and then impact the target and cause atoms to physically dislodge or sputter from the target surface. The sputtered atoms then propagate to a substrate or other work piece where they deposit a film of sputtered target material. The plasma is replenished by electron-ion pairs formed by the collision of neutral molecules with secondary electrons generated at the target surface.

Reactive sputtering systems inject a reactive gas or mixture of reactive gases into the sputtering system. The reactive gases react with the target material either at the target surface or in the gas phase, resulting in the deposition of new compounds. The pressure of the reactive gas can be varied to control the stoichiometry of the film. Reactive sputtering is useful for forming some types of molecular thin films.

Magnetron sputtering systems use magnetic fields that are shaped to trap and concentrate secondary electrons proximate to the target surface. The magnetic fields increase the density of electrons and, therefore, increase the plasma density in a region that is proximate to the target surface. The increased plasma density increases the sputter deposition rate.

BRIEF DESCRIPTION OF DRAWINGS

This invention is described with particularity in the detailed description. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
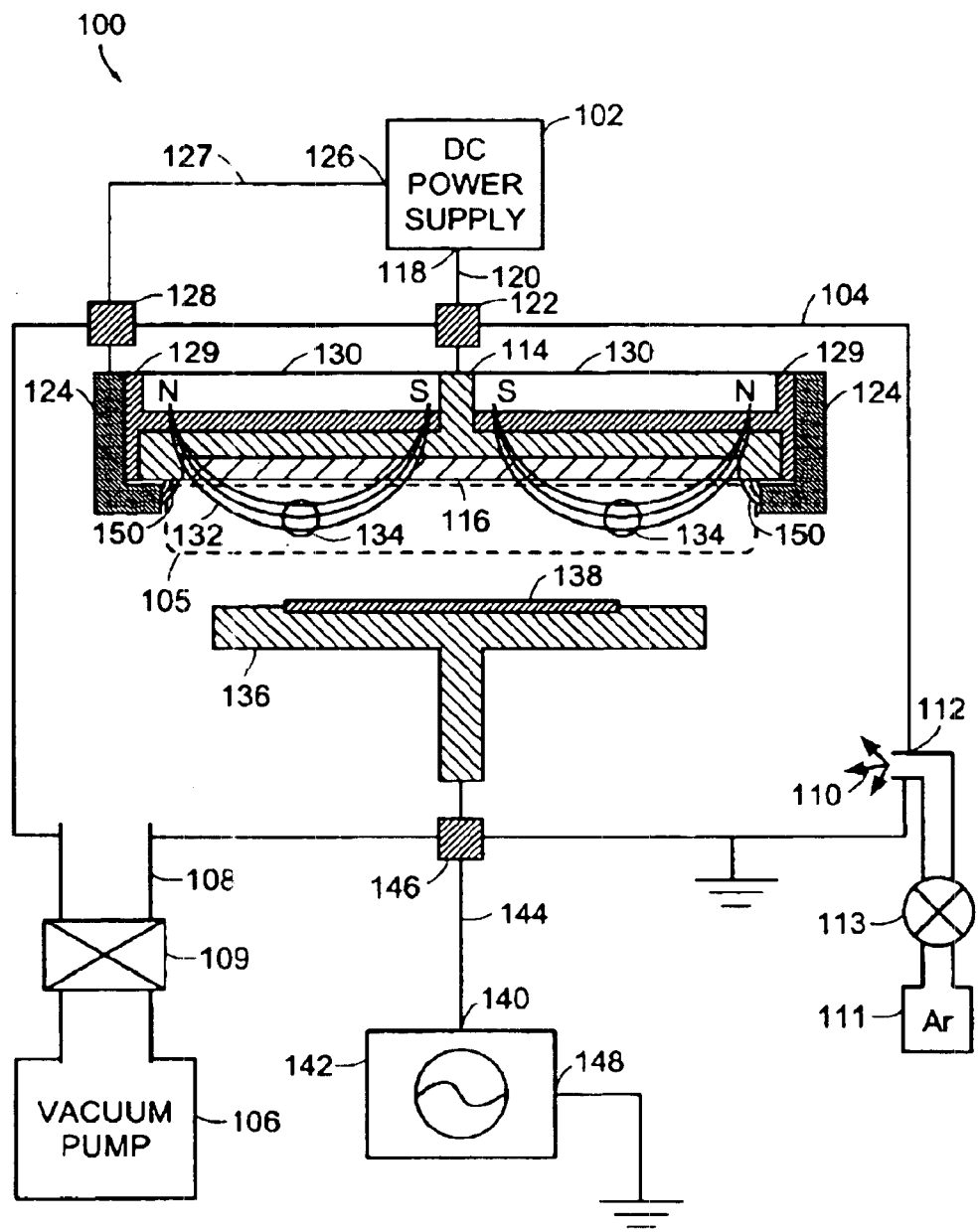
FIG. 1 illustrates a cross-sectional view of a known plasma sputtering apparatus having a DC power supply.

FIG. 1 illustrates a cross-sectional view of a known plasma sputtering apparatus 100 having a DC power supply 102. The known plasma sputtering apparatus 100 includes a vacuum chamber 104 where a plasma 105 is generated. The vacuum chamber 104 can be coupled to ground. The vacuum chamber 104 is positioned in fluid communication with a vacuum pump 106 via a conduit 108 and a valve 109. The vacuum pump 106 is adapted to evacuate the vacuum chamber 104 to high vacuum. The pressure inside the vacuum chamber 104 is generally less than $10^{-1}$ Torr. A feed gas 110 from a feed gas source 111, such as an argon gas source, is introduced into the vacuum chamber 104 through a gas inlet 112. The gas flow is controlled by a valve 113.

The plasma sputtering apparatus 100 also includes a cathode assembly 114. The cathode assembly 114 is generally in the shape of a circular disk. The cathode assembly 114 can include a target 116. The cathode assembly 114 is electrically connected to a first terminal 118 of the DC power supply 102 with an electrical transmission line 120. An insulator 122 isolates the electrical transmission line 120 from a wall of the vacuum chamber 104. An anode 124 is electrically connected to a second terminal 126 of the DC power supply 102 with an electrical transmission line 127. An insulator 128 isolates the electrical transmission line 127 from the wall of the vacuum chamber 104. The anode 124 is positioned in the vacuum chamber 104 proximate to the cathode assembly 114. An insulator 129 isolates the anode 124 from the cathode assembly 114. The anode 124 and the second output 126 of the DC power supply 102 are coupled to ground in some systems.

The plasma sputtering apparatus 100 illustrates a magnetron sputtering system that includes a magnet 130 that generates a magnetic field 132 proximate to the target 116. The magnetic field 132 is strongest at the poles of the magnet 130 and weakest in the region 134. The magnetic field 132 is shaped to trap and concentrate secondary electrons proximate to the target surface. The magnetic field increases the density of electrons and, therefore, increases the plasma density in a region that is proximate to the target surface.

The plasma sputtering apparatus 100 also includes a substrate support 136 that holds a substrate 138 or other work piece. The substrate support 136 can be electrically connected to a first terminal 140 of a RF power supply 142 with an electrical transmission line 144. An insulator 146 isolates the RF power supply 142 from a wall of the vacuum chamber 104. A second terminal 148 of the RF power supply 142 is coupled to ground.

In operation, the feed gas 110 from the feed gas source 111 is injected into the chamber 104. The DC power supply 102 applies a DC voltage between the cathode assembly 114 and the anode 124 that causes an electric field 150 to develop between the cathode assembly 114 and the anode 124. The amplitude of the DC voltage is chosen so that it is sufficient to cause the resulting electric field to ionize the feed gas 110 in the vacuum chamber 104 and to ignite the plasma 105.

The ionization process in known plasma sputtering apparatus is generally referred to as direct ionization or atomic ionization by electron impact and can be described by the following equation:

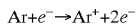

where Ar represents a neutral argon atom in the feed gas 110 and $e^-$ represents an ionizing electron generated in response to the voltage applied between the cathode assembly 114 and the anode 124. The collision between the neutral argon atom and the ionizing electron results in an argon ion ($Ar^+$) and two electrons.

The plasma 105 is maintained, at least in part, by secondary electron emission from the cathode assembly 114. The magnetic field 132 that is generated proximate to the cathode assembly 114 confines the secondary electrons in the region 134 and, therefore, confines the plasma 105 approximately in the region 134. The confinement of the plasma in the region 134 increases the plasma density in the region 134 for a given input power.

Since the cathode assembly 114 is negatively biased, ions in the plasma 105 bombard the target 116. The impact caused by these ions bombarding the target 116 dislodges or sputters material from the target 116. A portion of the sputtered material forms a thin film of sputtered target material on the substrate 138.

Known magnetron sputtering systems have relatively poor target utilization. The term "poor target utilization" is defined herein to mean undesirable non-uniform erosion of target material. Poor target utilization is caused by a relatively high concentration of positively charged ions in the region 134 that results in a non-uniform plasma. Similarly, magnetron etching systems (not shown) typically have relatively non-uniform etching characteristics.

Increasing the power applied to the plasma can increase the uniformity and density of the plasma. However, increasing the amount of power necessary to achieve even an incremental increase in uniformity and plasma density can significantly increase the probability of establishing an electrical breakdown condition leading to an undesirable electrical discharge (an electrical arc) in the chamber 104.

Applying pulsed direct current (DC) to the plasma can be advantageous since the average discharge power can remain relatively low while relatively large power pulses are periodically applied. Additionally, the duration of these large voltage pulses can be preset so as to reduce the probability of establishing an electrical breakdown condition leading to an undesirable electrical discharge. An undesirable electrical discharge will corrupt the plasma process and can cause contamination in the vacuum chamber 104. However, very large power pulses can still result in undesirable electrical discharges regardless of their duration.

In one embodiment, an apparatus according to the present invention generates a plasma having a higher density of ions for a giving input power than a plasma generated by known plasma systems, such as the plasma sputtering apparatus 100 of FIG. 1.

Figure 2:
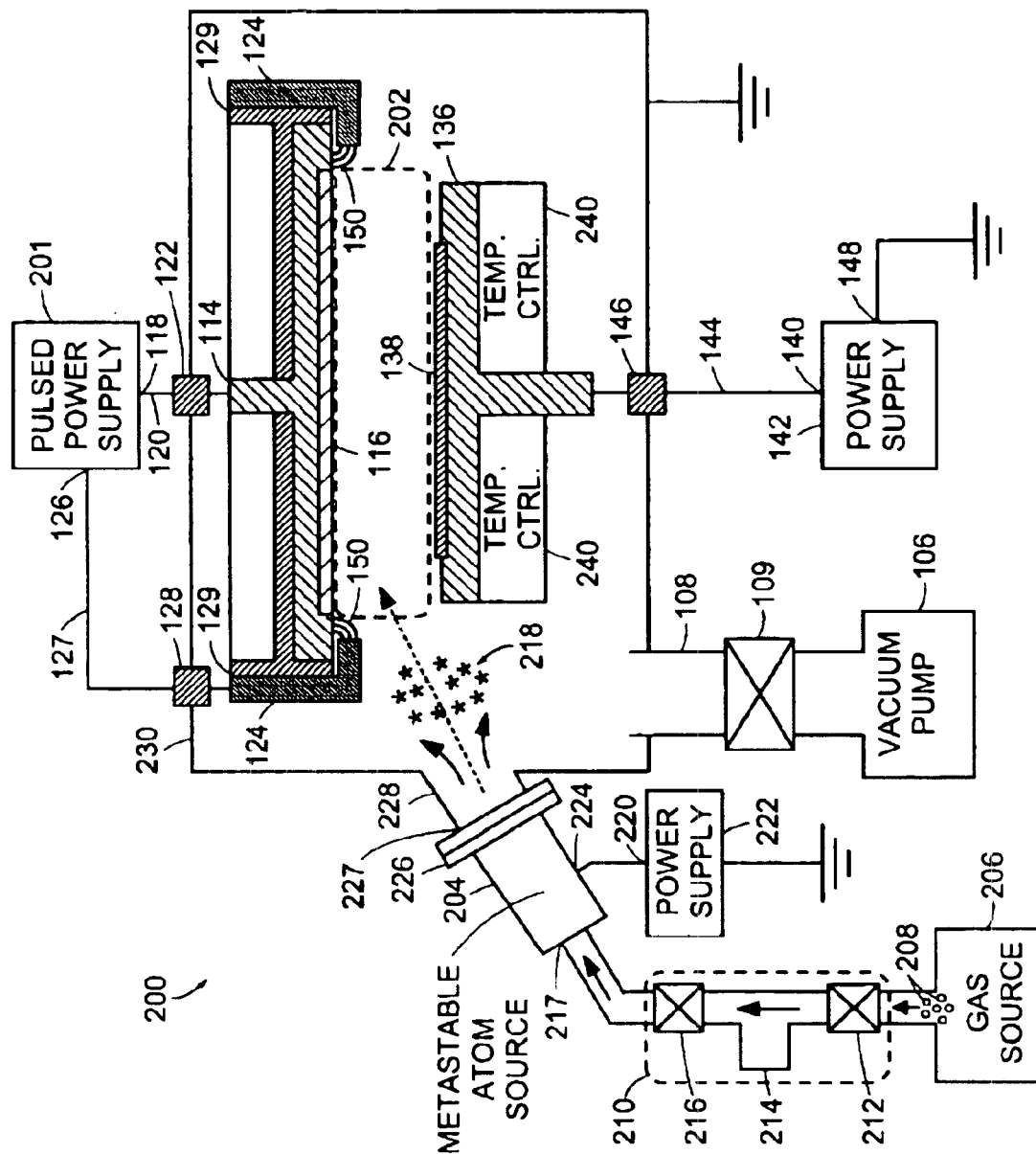
FIG. 2 illustrates a cross-sectional view of an embodiment of a plasma generator that generates a plasma with a multi-step ionization process according to the present invention.

FIG. 2 illustrates a cross-sectional view of an embodiment of a plasma generator 200 that generates a plasma 202 with a multi-step ionization process according to the present invention. In one embodiment, the plasma generator 200 includes an exited atom source that generates excited atoms from ground state atoms from a feed gas source 206. In the embodiment shown, the excited atom source is a metastable atom source 204 that generates metastable atoms from the feed gas source 206. The feed gas source 206 provides a volume of ground state atoms 208 to the metastable atom source 204. The feed gas source 206 can provide any type of feed gas or mixture of feed gases, such as, noble gases, reactive gases, and mixtures of noble gases and reactive gases. In one embodiment, the feed gas source 206 comprises a source of ground state noble gas atoms. For example, in one embodiment, the feed gas source 206 comprises a source of ground state argon atoms.

The feed gas source 206 is coupled to the metastable atom source 204 through a gas flow control system 210. In one embodiment, the gas flow control system 210 includes a first gas valve 212, a mass flow controller 214, and a second gas valve 216. The gas flow control system 210 can include any number of gas valves and/or mass flow controllers. The gas flow control system 210 controls the volume and the flow rate of the ground state atoms 208 flowing into the metastable atom source 204. In one embodiment, the metastable atom source 204 includes a means of controlling the pressure of the feed gas inside the metastable atom source.

The metastable atom source 204 receives the ground state atoms 208 from the gas flow control system 210 at an input 217. The metastable atom source 204 generates a volume of metastable atoms 218 from the volume of ground state atoms 208. In one embodiment, the metastable atom source generates a volume of ions that is relatively small compared with the volume of metastable atoms 218. A first output terminal 220 of a power supply 222 is coupled to an electrical input 224 of the metastable atom source 204. The type of power supply depends upon the type of metastable atom source. For example, the power supply 222 can be a pulsed power supply, a radio frequency (RF) power supply, an alternating current (AC) power supply, or a direct current (DC) power supply.

The plasma generator of the present invention can use any type of metastable atom source 204. Skilled artisans will appreciate that there are many methods of exciting ground state atoms 208 to a metastable state, such as electron impact ionization, photo excitation, or thermal excitation. The operation of specific embodiments of metastable atom sources are discussed in more detail herein. For example, in one embodiment, the metastable atom source 204 includes a parallel plate discharge chamber (not shown) that receives the volume of ground state atoms 208 from the gas flow control system 210 and that generates a discharge that excites a portion of the volume of ground state atoms 208 to a metastable state.

In another embodiment, the metastable atom source 204 includes an electron gun (not shown) that receives the volume of ground state atoms 208 from the gas flow control system 210 and that generates and accelerates an electron beam that excites a portion of the volume of ground state atoms 208 to a metastable state. In yet another embodiment, the metastable atom source 204 includes an inductively coupled discharge chamber that receives the volume of ground state atoms 208 from the gas flow control system 210 and that generates a discharge that excites a portion of the volume of ground state atoms 208 to a metastable state.

A flange 226 couples an output 227 of the metastable atom source 204 to an input port 228 of a plasma chamber 230. The metastable atom source 204 can be coupled to any type of process chamber, such as the chamber 104 of FIG. 1. In fact, a plasma generator according to the present invention can be constructed by coupling a metastable atom source to a commercially available plasma chamber. Thus, commercially available plasma generators can be modified to generate a plasma using a multi-step ionization process according to the present invention.

In one embodiment, a diameter of the input 217 of the metastable atom source 204 is different than a diameter of the output 227 of the metastable atom source 204. This difference in diameters creates a pressure differential between the input 217 and the output 227 of the metastable atom source 204. The rate of metastable generation in the metastable atom source 204 depends upon the pressure inside the source 204. In some embodiments, at least one of the diameter of the input 217 and the diameter of the output 227 of the metastable atom source 204 is chosen so that a pressure differential is created that increases the generation rate of the metastable atoms 218 in the metastable atom source 204.

The plasma chamber 230 confines the volume of metastable atoms 218. In one embodiment, the output of the metastable atom source 204 is positioned so as to direct the volume of metastable atoms 218 towards the cathode assembly 114. In one embodiment, the geometry of the plasma chamber 230 and the cathode assembly 114 is chosen so that the metastable atoms reach the cathode assembly 114 at a time that is much less than an average transition time of the metastable atoms to ground state atoms. In some embodiments, ground state atoms from the metastable atom source 204 gain energy in the metastable atom source 204, but do not actually become metastable atoms until they reach the plasma chamber 230. Ground state atoms from the metastable atom source 204 can become metastable atoms at any place along the path from the metastable atom source 204 to the cathode assembly 114. In some embodiments, the metastable atom source 204 generates some excited atoms that are in excited states other than a metastable state.

The plasma chamber 230 is positioned in fluid communication with the vacuum pump 106 via the conduit 108 and the vacuum valve 109. The vacuum pump 106 evacuates the plasma chamber 230 to high vacuum. The pressure inside the plasma chamber 230 is generally maintained at less than $10^{-1}$ Torr for plasma processing. In one embodiment, a feed gas (not shown) from a second feed gas source (not shown), such as an argon gas source, is introduced into the plasma chamber 230 through a gas inlet (not shown).

In one embodiment, the power supply 201 is a pulsed power supply that is electrically coupled to the cathode assembly 114 with the electrical transmission line 120. In one embodiment, the duration of the pulse is chosen to optimize a process parameter. In other embodiments, the power supply 201 is a RF power supply, an AC power supply, or a DC power supply. The isolator 122 insulates the electrical transmission line 120 from the plasma chamber 230. The second output 126 of the power supply 102 is electrically coupled to the anode 124 with the electrical transmission line 127. The isolator 128 insulates the electrical transmission line 127 from the plasma chamber 230. Another isolator 129 insulates the anode 124 from the cathode assembly 114. Numerous other cathode and anode configurations known in the art can be used with the plasma generator of the present invention. In one embodiment, the plasma chamber 230 is coupled to ground potential.

The cathode assembly 114 is formed of a metallic material, such as stainless steel or any other material that does not chemically react with reactive gases. In one embodiment (not shown), the cathode assembly 114 includes a sputtering target 116 that is used for sputtering materials onto a substrate or other work piece. The sputtering target 116 can include any type of material. For example, the sputtering target 116 can be formed of magnetic, non-magnetic, dielectric, metals, and semiconductor materials.

In one embodiment, a magnet (not shown) is disposed proximate to the cathode assembly 114. The magnet generates a magnetic field that traps electrons in the plasma proximate to the cathode assembly 114 and, therefore, increases the plasma density In the region proximate to the cathode assembly 114.

The substrate support 136 is disposed in the plasma chamber 230. The substrate support 136 is designed to support a substrate 138 or other work piece. In one embodiment, a temperature controller 240 is positioned in thermal communication with the substrate support 136. The temperature controller 240 can increase or decrease the temperature of the substrate 138. In some embodiments, the temperature controller 240 is used to control the temperature of the substrate for various reasons including enhancing a chemical reaction, increasing a growth rate, and improving adhesion.

In one embodiment, the power supply 142 is used to apply a bias voltage to the substrate 138. The first output 140 of the power supply 142 is coupled to the substrate support 136 with the transmission line 144. The isolator 146 insulates the transmission line 144 from a wall of the plasma chamber 230. The second output 148 of the power supply 142 is coupled to ground. The power supply 142 can be any type of pulsed power supply such as a RF power supply, an AC power supply, or a DC power supply.

The plasma generator 200 of FIG. 2 uses a multi-step or stepwise ionization process to generate the plasma 202. The term "multi-step ionization process" is defined herein to mean an ionization process whereby ions are ionized in at least two distinct steps. However, the term "multi-step ionization process" as defined herein may or may not include exciting ground state atoms to a metastable state. For example, one multi-step ionization process according to the present invention includes a first step where atoms are excited from a ground state to a metastable state and a second step where atoms in the metastable state are ionized. Another multi-step ionization process according to the present invention includes a first step where atoms are excited from a ground state to an excited state and a second step where atoms in the excited state are ionized. The term "multi-step ionization process" also includes ionization processes with three or more steps.

In operation, the plasma generator 200 operates as follows. The gas flow control system 210 supplies ground state atoms 208 from the feed gas source to the metastable atom source 204. The power supply 222 applies a voltage to the volume of ground state atoms 208. The voltage excites at least a portion of the volume of the ground state atoms 208 to creates a volume of metastable atoms 218. In one embodiment. the power supply 222 applies a voltage to the volume of ground state atoms 208. In one embodiment, the duration of the voltage pulse is chosen to optimize a process parameter, such as the rate of metastable atom generation or the efficiency of metastable atom generation.

The term "metastable atoms" is defined herein to mean excited atoms having energy levels from which dipole radiation is theoretically forbidden. Metastable atoms have relatively long lifetimes compared with other excited atoms. Metastable atoms are created because, in theory, the selection rules forbid relaxation of these excited atoms to the ground state and the emission of dipole radiation. However, the selection rules were determined using certain approximations. Consequently, in practice, there is a finite probability that the metastable atoms relax to the ground state and emit dipole radiation. The actual lifetime of metastable atoms is on the order of milliseconds to minutes. For example, lifetimes for argon metastables are 44.9 seconds and 55.9 seconds for metastable energies of 11.723 eV and 11.548 eV, respectively.

All noble gases have metastable states. For example, argon metastable atoms can be generated by a two-step ionization process. In the first step, ionizing electrons e⁻ are generated by applying a sufficient voltage between the cathode assembly 114 and the anode 124. When an ionizing electron e⁻ collides with a ground state argon (Ar) atom, a metastable argon atom and an electron are generated. Argon has two metastable states, see Fabrikant, I. I., Shpenik, O. B., Snegursky, A. V., and Zavilopulo, A. N., *Electron Impact Formation of Metastable Atoms*, North-Holland, Amsterdam. The first metastable state is represented in jl-coupling notation as follows:

$$4s[3/2]_0^o$$

and is represented in the LS-coupling configuration as follows:

$$3p^5(^2P_{3/2}^o)4s\,^3P_2$$

The energy and lifetime of the first metastable state are 11.548 eV and 55.9 seconds, respectively.

The second metastable state is represented in jl-coupling notation as follows:

$$4s^1[1/2]_0^o$$

and is represented in the LS-coupling configuration as follows:

$$3p^5\,(^2P_{3/2}^o)4s\,^3P_0$$

The energy and lifetime of the second metastable state are 11.723 eV and 44.9 seconds, respectively.

Metastable atoms can be present in considerable densities in weakly ionized discharges. In the second step, an ionizing electron e⁻ collides with the metastable argon atom and the metastable argon atom is ionized and two electrons are generated, as shown below.

$$Ar+e^-\rightarrow Ar^*+e^-$$

$$Ar^*+e^-\rightarrow Ar^++2e^-$$

Plasma generation using multi-step ionization according to the present invention is described in connection with the generation of metastable atoms. However, the present invention is not limited to multi-step ionization using metastable atoms. Plasma generation using multi-step ionization according to the present invention can be achieved by generating metastable molecules. In other embodiments, plasma generation using multi-step ionization can be achieved by generating excited atoms other than metastable atoms.

Electrons are formed in the metastable atom source 204 along with the volume of metastable atoms 218. In addition, a relatively small volume of ions are formed by direct ionization. In one embodiment, the volume of ions and volume of electrons are removed from the volume of metastable atoms 218 before the metastable atoms 218 are injected into the plasma chamber 230, as described herein. The volume of metastable atoms 218 are injected into the plasma chamber 230 adjacent to the cathode assembly 114.

In one embodiment, a pressure at the input 217 of the metastable atom source 204 is lower than a pressure at the output 227 of the metastable atom source 204. The pressure differential increases the efficiency at which the metastable atoms 218 are generated in the metastable atom source 204. In addition, the pressure differential causes the volume of metastable atoms 218 to be rapidly injected into the plasma chamber 230. The rapid injection generally increases the density of the metastable atoms 218 at the cathode assembly 114.

After a sufficient volume of metastable atoms 218 is present in the plasma chamber 230, the DC power supply 102 generates an electric field 150 proximate to the volume of metastable atoms 218 between the cathode assembly 114 and the anode 124. The electric field 150 raises the energy of the volume of metastable atoms 218 causing collisions between neutral atoms, electrons, and metastable atoms 218. These collisions generate the plasma 202 proximate to the cathode assembly 114. The plasma 202 includes ions, excited atoms and additional metastable atoms 218. The efficiency of the multi-step ionization process increases as the density of metastable atoms 218 in the plasma chamber 230 increases.

In one embodiment (not shown) a magnetic field is generated proximate to the center of the cathode assembly 114. The magnetic field can increase the ion density of the plasma 202 by trapping electrons in the plasma 202 and also by trapping secondary electrons proximate to the cathode 114.

Also, in one embodiment (not shown), a feed gas from a feed gas source (not shown) is injected directly into the plasma chamber 230. The feed gas source supplies an additional volume of ground state atoms to the plasma 202. These ground state atoms are ionized by direct ionization. The directly ionized ground state atoms increase the ion density of the plasma 202.

The multi-step ionization process described herein substantially increases the rate at which the plasma 202 is formed and therefore, generates a relatively dense plasma.

The rate is increased because only a relatively small amount of energy is required to ionize the metastable atoms. For example, ground state argon atoms require an energy of about 15.76 eV to ionize. However, argon metastable atoms require only about 4 eV of energy to ionize. Although energies of about 11.55 eV and 11.72 eV are necessary to reach argon metastable states, this energy is provided by the metastable atom source. Therefore, a volume of metastable atoms 218 will ionize at a much higher rate than a similar volume of ground state atoms 208 for the same input energy.

Furthermore, as the density of the metastable atoms 218 in the plasma 202 increases, the efficiency of the ionization process rapidly increases. The increased efficiency results in an avalanche-like process that substantially increases the density of the plasma 202. In addition, the ions in the plasma 202 strike the cathode 114 causing the secondary electron emission from the cathode 114. The secondary electrons interact with ground state atoms 208 and with the metastable atoms 218 in the plasma 202. This interaction further increases the density of ions in the plasma 202 as additional volumes of metastable atoms 218 enter the plasma chamber 230. Thus, for the same input energy, the density of the plasma 202 that is generated by the multi-step ionization process according to the present invention is significantly greater than a plasma that is generated by direct ionization of ground state atoms.

FIG. 2 depicts an electric field 150 that raises an energy of metastable atoms 218 in the volume of metastable atoms 218 so that at least a portion of the metastable atoms 218 are ionized, thereby generating the plasma 202 with a multi-step ionization process. However, other energy sources can be used to raise the energy of the metastable atoms 218 without departing from the scope of the invention. For example, the energy source can be chosen from the group comprising a planar discharge source, a radio frequency (RF) diode source, an ultraviolet (UV) source, an X-ray source, an electron beam source, an ion beam source, an inductively coupled plasma (ICP) source, a capacitively coupled plasma (CCP) source, a microwave plasma source, an electron cyclotron resonance (ECR) source, a helicon plasma source, a magnetron source and an AC discharge source.

Once a plasma having the desired characteristics is generated, the plasma 202 can be used in the processing of the workpiece 138. For example, in a plasma etch process, ions in the plasma can be used to etch the workpiece 138 when the workpiece is appropriately biased by the power supply 142. In a plasma sputtering application, ions in the plasma can be used to sputter material from the target 116. The sputtered material is deposited on the workpiece 138 to form a thin film.

Figure 3:
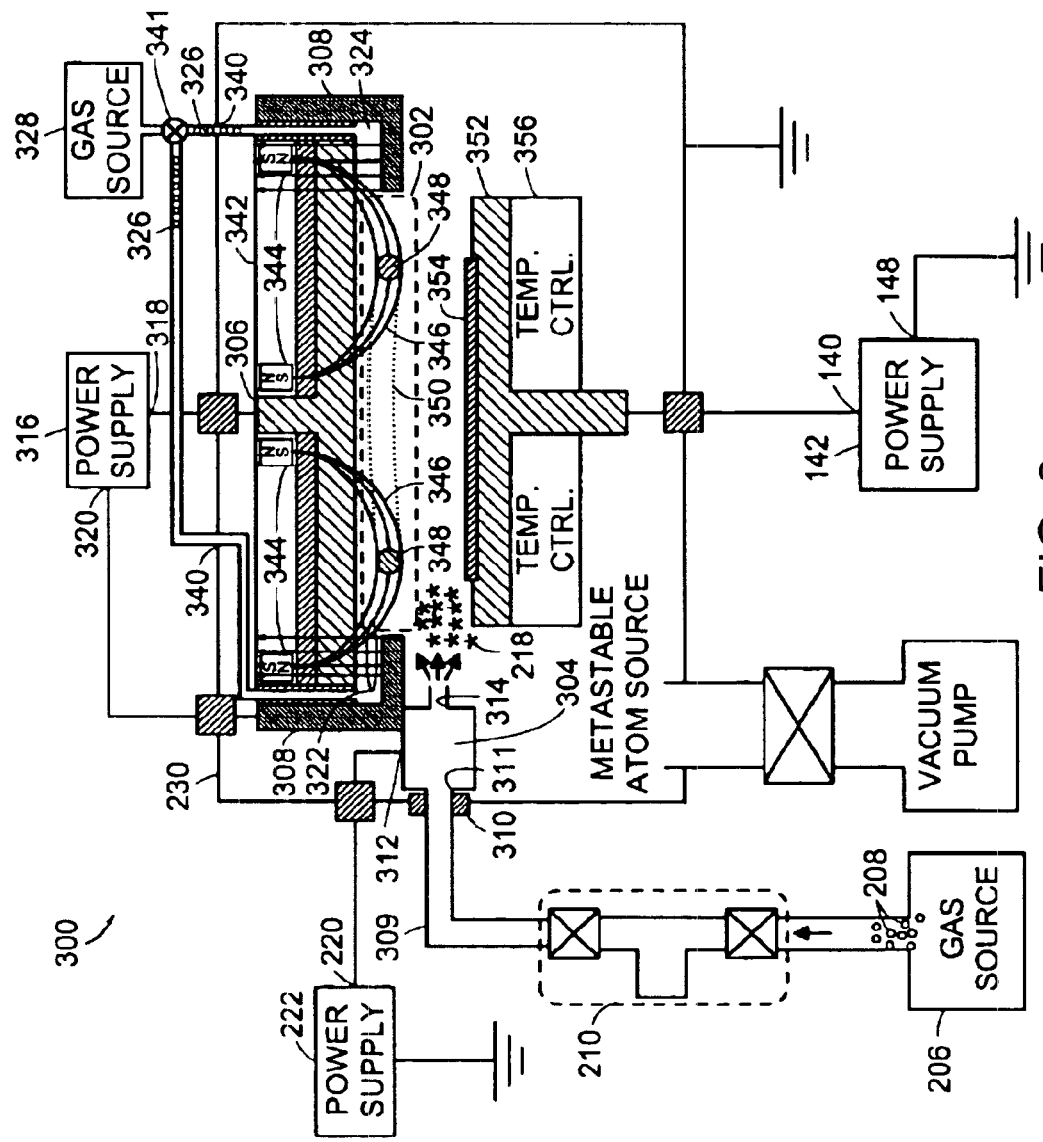
FIG. 3 illustrates a cross-sectional view of another embodiment of a plasma generator that generates a plasma with a multi-step ionization process according to the present invention.

FIG. 3 illustrates a cross-sectional view of another embodiment of a plasma generator 300 according to the present invention that generates a plasma 302 with a multi-step ionization process according to the present invention. The plasma generator 300 is similar to the plasma generator 200 of FIG. 2. The plasma generator 300 includes an excited atom source that, in one embodiment, is a metastable atom source 304. The plasma generator 300 includes the metastable atom source 304, a cathode 306 and an anode 308. The metastable atom source 304 is positioned inside the plasma chamber 230 rather than coupled to the plasma chamber 230 with a flange as shown in FIG. 2. The metastable atom source 304 can be retrofitted to commercially available plasma chambers. The plasma generator 300 also includes a magnet assembly 342.

The plasma generator 300 can use any type of metastable atom source 304 that can be positioned inside of the plasma chamber 230. In one embodiment, the metastable atom source 304 includes a parallel plate discharge chamber (not shown). In another embodiment, the metastable atom source 304 includes an electron gun (not shown) that receives the volume of ground state atoms 208 from the gas flow control system 210 and that generates and accelerates an electron beam that excites a portion of the volume of ground state atoms 208 to a metastable state. In yet another embodiment, the metastable atom source 204 includes an inductively coupled discharge chamber that receives the volume of ground state atoms 208 from the gas flow control system 210 and that generates a discharge that excites a portion of the volume of ground state atoms 208 to a metastable state.

The metastable atom source 304 is coupled to the feed gas source 206 through a gas line 309 that is connected to the gas flow control system 210. In one embodiment, an isolator 310 isolates the gas line 306 from a wall of the plasma chamber 230. Additional in-line insulating couplers (not shown) can be used to insulate the gas line 309 and/or the gas flow control system 210 from the feed gas source 206. The feed gas source 206 supplies the ground state atoms 208 to an input 311 of the metastable atom source 304. The gas flow control system 210 controls the volume and the flow rate of the ground state atoms 208 to the metastable atom source 304.

A first output 220 of the power supply 222 is coupled to an electrical input 312 of the metastable atom source 304. The type of power supply depends upon the type of metastable atom source. For example, the power supply 222 can be a pulsed power supply, a RF power supply, an AC power supply, or a DC power supply. The metastable atom source 304 receives the ground state atoms 208 and generates a discharge which excites at least a portion of the ground state atoms 208 to a metastable state. In some embodiments, a portion of the ground state atoms 208 are excited to a state other than a metastable state. The operation of specific embodiments of the metastable atom source 304 will be discussed in more detail herein.

An output 314 of the metastable atom source 304 is adapted to inject a volume of metastable atoms 218 proximate to the cathode 306. In one embodiment, the metastable atom source 304 injects the volume of metastable atoms 218 proximate to the cathode 306 through the use of a gas injector (not shown), such as a showerhead-type injector. In one embodiment, a diameter of the input 311 of the metastable atom source 304 is different from a diameter of the output 314 of the metastable atom source 304. In this embodiment, the difference in diameters creates a pressure differential that increases the generation rate of the metastable atoms 218 in the metastable atom source 304.

In one embodiment, ground state atoms 326 from a second feed gas source 328, such as an argon gas source, are introduced into the plasma chamber 230 through one or more gas inlets 340. In some embodiments, the gas inlets 340 introduce the ground state atoms 320 directly into the region 324 between the anode 308 and the cathode 306. A gas valve 341 controls the flow rate of the ground state atoms 326 into the plasma chamber 230. The feed gas source 206 can provide any type of feed gas or mixture of feed gases, such as, noble gases, reactive gases, and mixtures of noble gases and reactive gases.

In one embodiment (not shown), the feed gas source 328 is replaced with a metastable atom source, such as the metastable atom source 204 described in connection with FIG. 2. In this embodiment, metastable atoms 218 are injected directly between the anode 308 and the cathode 306. Direct injection of metastable atoms 218 between the anode 308 and the cathode 306 increases the density of the plasma 302 because the metastable atoms require less energy than ground state atoms to ionize.

A power supply 316 is electrically coupled to the volume of metastable atoms 218. The power supply 316 can be any type of power supply, such as a pulsed power supply, a RF power supply, an AC power supply, or a DC power supply. A first output 318 of the power supply 316 is coupled to the cathode 306. A second output 320 of the power supply 316 is coupled to the anode 308. The power supply 316 generates an electric field 322 between the cathode 306 and the anode 308 that raises the energy of the volume of metastable atoms 218 so that at least a portion of the volume of metastable atoms 218 are ionized, thereby generating the plasma 302.

In one embodiment, a magnet assembly 342 is disposed proximate to the cathode 306. The magnet assembly 342 includes one or more magnets 344. The one or more magnets 344 generate a magnetic field 346 that traps electrons in a region 348 of the plasma 302 that is proximate to the cathode 234. The trapped electrons increase the ionization rate of the metastable atoms 218 and, therefore, increase the density of the plasma 302. In one embodiment (not shown), a magnetic field is generated in the region 324 in order to substantially trap electrons in the area where the plasma 302 is ignited. In this embodiment, the magnetic field in the region 324 assists in the ignition of the plasma 302.

The magnetic field 346 also traps secondary electrons generated at the cathode 306 by the electric field 322. The secondary electrons move in a substantially circular motion proximate to the cathode 306 according to crossed electric and magnetic fields. The substantially circular motion of the electrons generates the electron ExB drift current 350. The magnitude of the electron ExB drift current 350 is proportional to the magnitude of the discharge current in the plasma 302 and, in one embodiment, is approximately in the range of about three to ten times the magnitude of the discharge current.

In one embodiment, the electron ExB drift current 350 defines a substantially circular shape for a low current density plasma. However, as the current density of the plasma increases, the substantially circular electron ExB drift current 350 tends to have a more complex shape as the interaction of the magnetic field 346 generated by the magnet assembly 342, the electric field 322 generated by the power supply 316, and the magnetic field generated by the electron ExB drift current 350 becomes more acute. The exact shape of the electron ExB drift current 350 can be quite elaborate and depends on various factors. For example, in one embodiment, the electron ExB drift current 350 has a substantially cycloidal shape.

The electron ExB drift current 350 generates a magnetic field that interacts with the magnetic field 346 generated by the magnet assembly 342. The magnitude of the magnetic field generated by the electron ExB drift current 350 increases with increased electron ExB drift current 350. The magnetic field generated by the electron ExB drift current 350 has a direction that is substantially opposite to direction of the magnetic field 346 generated by the magnet assembly 342.

The interaction of the magnetic field 346 generated by the magnet assembly 342 and the magnetic field generated by the electron ExB drift current 350 generates magnetic field lines that are somewhat more parallel to the surface of the cathode 306 than the magnetic field lines generated by the magnet assembly 342. The somewhat more parallel magnetic field lines allow the plasma 302 to more uniformly distribute itself across the surface of the cathode 306 and, therefore, improves the uniformity of the plasma 302 proximate to the cathode 306.

The magnitude of the electron ExB drift current 350 is relatively high because of the presence of the metastable atoms 218 in the chamber 230. The metastable atoms 218 ionize at a much higher rate than a similar volume of ground state atoms 208. Therefore, the current density associated with the plasma 302 is higher than a current density associated with a plasma generated from ground state atoms 208 for the same input energy. The high current density associated with the plasma 302 generates the relatively large ExB drift current 350.

As the magnitude of the electron ExB drift current 350 increases, the magnetic field generated by the electron ExB drift current 350 becomes stronger and eventually overpowers the magnetic field 346 generated by the magnet assembly 342. The magnetic field lines that are generated by the magnet assembly 342 exhibit substantial distortion that is caused by the relatively strong magnetic field that is generated by the relatively large electron ExB drift current 350. Thus, a large electron ExB drift current 350 generates a magnetic field that strongly interacts with and can dominate the magnetic field 346 that is generated by the magnet assembly 342.

A substrate support 352 is disposed in the plasma chamber 230. The substrate support 352 is designed to support a substrate 354 or other work piece. In one embodiment, a temperature controller 356 is positioned in thermal communication with the substrate support 352 to regulate the temperature of the workpiece 354. The temperature controller 356 can increase or decrease the temperature of the substrate 354. In some embodiments, the temperature controller 356 is used to control the temperature of the substrate for various reasons including enhancing a chemical reaction, improve adhesion, and increasing deposition rate.

A first output 140 of the power supply 142 is coupled to the substrate support 352. The second output 148 of the power supply 142 is coupled to ground. The power supply 142 can by any type of power supply, such as a pulsed power supply, a RF power supply, an AC power supply, or a DC power supply. In some embodiments, the power supply 142 is used to apply a bias voltage to the substrate 354.

The operation of the plasma generator 300 is similar to the operation of the plasma generator 200 of FIG. 2. The gas flow control system 210 supplies ground state atoms 208 to the metastable atom source 304 from the gas source 206. The metastable atom source 304 generates a volume of metastable atoms 218 from the volume of ground state atoms 208 supplied by the feed gas source 206. Some excited atoms that are not in a metastable state can also be generated by the metastable atom source 304.

Ground state atoms 326 from the feed gas source 328 are injected in the region 324 between the anode 308 and the cathode 306. The metastable atoms 218 interact with the ground state atoms 326 in the region 324 between the anode 308 and the cathode 306. The power supply 316 then generates the electric field 322 across the mixture of metastable atoms 218 and ground state atoms 326. The electric field 322 raises the energy of the metastable atoms 218 and ground state atoms 326 so that at least a portion of the metastable atoms 218 and the ground state atoms 326 are ionized, thereby generating the plasma 302 with a combination of a direct ionization process and a multi-step ionization process. In other embodiments, the feed gas source 328 contains a molecular gas.

In other embodiments, the energy of the metastable atoms 218 and ground state atoms 326 is raised by other means, such as a planar discharge, a radio frequency discharge, an inductively coupled plasma discharge, a capacitively coupled plasma (CCP) discharge, a microwave plasma discharge, an electron cyclotron resonance plasma discharge, a helicon plasma discharge, ultraviolet light, X-ray radiation, electron beam radiation, or ion beam radiation.

The one or more magnets 344 generate a magnetic field 346 that traps electrons in a region 348 of the plasma 302 that is proximate to the cathode 234. The magnetic field 346 also traps secondary electrons generated at the cathode 306 by the electric field 322. The trapped electrons further increases the ionization rate of the metastable atoms and the ground state atoms and, thus further increases the density of the plasma 302.

As the plasma 302 is being generated, additional ground state atoms 326 are injected in the region 324. These additional ground state atoms 326 displace the plasma 302 in the region 324. Meanwhile, additional metastable atoms 218 are generated by the metastable atom source 304. These additional metastable atoms 218 commingle with the plasma 302 and with the ground state atoms 326. The commingling of additional metastable atoms 218 further increases the density of ions.

The resulting plasma 302 is much denser than plasmas generated solely by direct ionization using similar plasma generating equipment and power levels. In one embodiment, the resulting plasma is at least twice as dense as a plasma generated solely by direct ionization. There are many applications for such a high density plasma. For example, the high density plasma can be used for high-deposition rate sputtering or high-deposition rate ion-assisted chemical vapor deposition.

Figure 4:
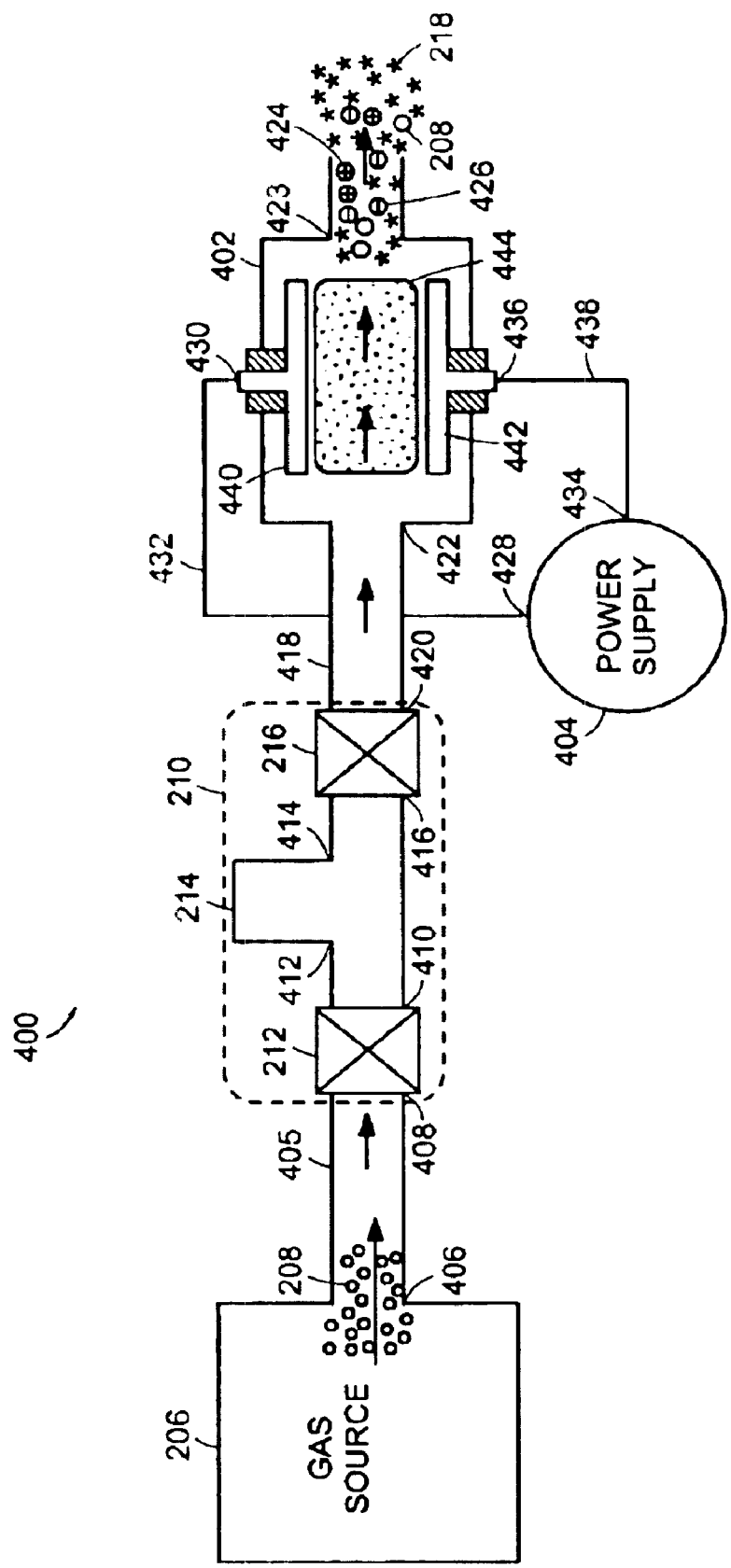
FIG. 4 illustrates a cross-sectional view of an embodiment of an excited atom generator that includes an excited atom source, such as a metastable atom source according to the present invention.

FIG. 4 illustrates a cross-sectional view of an embodiment of an excited atom generator 400 that includes an excited atom source such as a metastable atom source 402 according to the invention. The excited atom generator 400 includes the gas source 206 and the gas flow control system 210. There are many possible configurations for the excited atom generator 400. In one embodiment, the gas flow control system 210 includes the first gas valve 212, the mass flow controller 214, and the second gas valve 216.

An output 406 of the gas source 206 is coupled to one end of a gas line 405. The other end of the gas line 405 is coupled to an input 408 of the first gas valve 212. An output 410 of the first gas valve 212 is coupled to an input 412 of the mass flow controller 214. An output 414 of the mass flow controller 214 is coupled to an input 416 of the second gas valve 216. One end of a gas line 418 is coupled to an output 420 of the second gas valve 216. The other end of the gas line 418 is coupled to an input 422 of the metastable atom source 402. An output 423 of the metastable atom source 402 generates the volume of metastable atoms 218.

A power supply 404 is electrically coupled to metastable atom source 402. The power supply 404 can be a DC, an AC, a RF, or a pulsed power supply. A first output 428 of the power supply 404 is coupled to a first input 430 of the metastable atom source 402 with a first transmission line 432. A second output 434 of the power supply 404 is coupled to a second input 436 of the metastable atom source 402 with a second transmission line 438. The first input 430 of the metastable atom source 402 is coupled to a first electrode 440 in the metastable atom source 402. The second input 436 of the metastable atom source 402 is coupled to a second electrode 442 in the metastable atom source 402.

In operation, ground state atoms 208 from the gas source 206 flow to the metastable atom source 402 through the gas flow control system 210. The gas flow control system 210 controls the flow rate of the ground state atoms 208 from the gas source 206. The ground state atoms 208 flow between the first electrode 440 and the second electrode 442. The first 440 and the second electrodes 442 are energized by the power supply 404, such that a discharge is created in a discharge region 444 between the first 440 and the second electrodes 442. At least a portion of the ground state atoms 208 that are injected through the discharge region 444 are energized to a metastable state. For example, Argon atoms require a 11.56 eV energy to excite ground state Argon atoms to a metastable state. The energy required to excite ground state Argon atoms is lower than the 15.76 eV energy that is required to ionize ground state Argon atoms. Therefore, a relatively large number of Argon atoms are excited to the metastable state.

Some of the ground state atoms 208 are directly ionized, which releases ions 424 and electrons 426 into the stream of metastable atoms 218. Direct ionization occurs when bound electrons in an atom are ejected from that atom. The metastable atoms 218, the free ions 424 and electrons 426 then pass through the output 423 of the metastable atom source 402.

Figure 5:
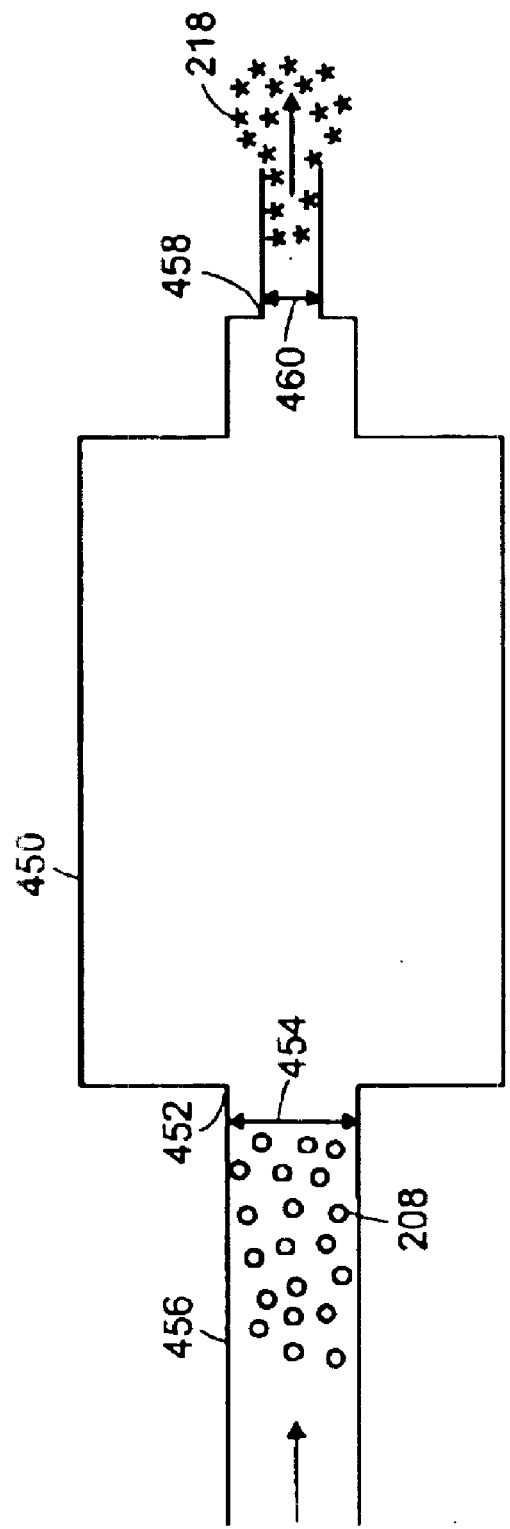
FIG. 5 illustrates a cross-sectional view of an embodiment of a chamber of an excited atom source such as a metastable atom source according to the present invention.

FIG. 5 illustrates a cross-sectional view of one embodiment of a chamber 450 of an excited atom source such as a metastable atom source according to the present invention. The chamber 450 includes an input 452 having a first diameter 454. A gas line 456 from a gas source (not shown) is coupled to the input 452 of the chamber 450. The chamber 450 also includes an output 458 having a second diameter 460.

In one embodiment, the first diameter 454 of the input 452 is greater than the second diameter 460 of the output 458. The difference in the first 454 and the second diameters 460 creates a pressure differential between the input 452 and the output 458 of the chamber 450. In one embodiment, the pressure differential is chosen so that the pressure in the chamber 450 is increased. The increase in pressure can improve the efficiency of the generation of the metastable atoms 218 from the ground state atoms 208. In one embodiment, the ratio of the first diameter 454 to the second diameter 460 is chosen to optimize the excitation process in the chamber 450. In addition, the pressure differential can increase the velocity of the metastable atoms 218 flowing through the output 458.

Figure 6:
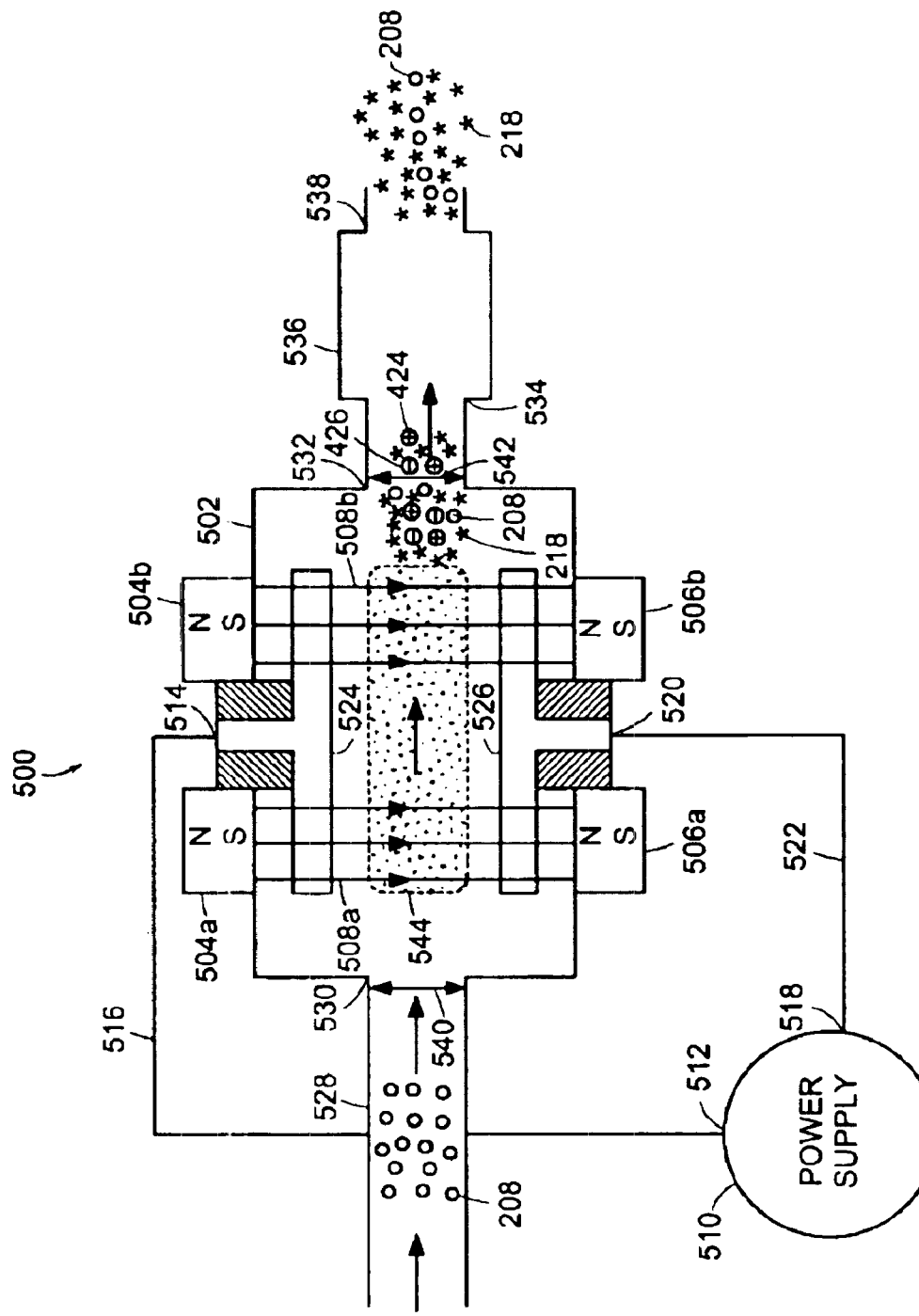
FIG. 6 illustrates a cross-sectional view of an excited atom source such as a metastable atom source according to the invention.

FIG. 6 illustrates a cross-sectional view of an embodiment of an excited atom source such as a metastable atom source 500 according to the invention. The metastable atom source 500 is similar to the metastable atom source 402 of FIG. 4. The metastable atom source 500 includes a chamber 502. The metastable atom source 500 also includes first 504a, b and second magnets 506a, b that create magnetic fields 508a, b through the chamber 502.

A power supply 510 is coupled to the metastable atom source 500. For example, the power supply 510 can be a DC, an AC, a RF, or a pulsed power supply. A first output 512 of the power supply 510 is coupled to a first input 514 of the metastable atom source 500 with a first transmission line 516. A second output 518 of the power supply 510 is coupled to a second input 520 of the metastable atom source 500 with a second transmission line 522. The first input 514 of the metastable atom source 500 is coupled to a first electrode 524 in the chamber 502. The second input 520 of the metastable atom source 500 is coupled to a second electrode 526 in the chamber 502.

A gas line 528 is coupled to an input 530 of the chamber 502. An output 532 of the chamber 502 is coupled to an input 534 of an electron/ion absorber 536. The electron/ion absorber 536 prevents a substantial fraction of the electrons 426 and ions 424 in the chamber 502 from passing to an output 538 of the electron/ion absorber 536. Specific embodiments of the electron/ion absorber 536 are described herein. In one embodiment, a diameter 540 of the input 530 of the chamber 502 and a diameter 542 of the output 532 of the chamber 502 can be varied to optimize the process of generating the metastable atoms 218.

In operation, ground state atoms 208 from the gas source (not shown) flow to the metastable atom source 500 through the input 530 of the chamber 502. The ground state atoms 208 flow between the first electrode 524 and the second electrode 526. The first 524 and the second electrodes 526 are energized by the power supply 510, such that an electric field is created that generates a discharge in a discharge region 544 between the first 524 and the second electrodes 526. The ground state atoms 208 that are injected through the discharge region 540 are energized to a metastable state. Some of those ground state atoms 208 are energized to the point of ionization, which releases free ions 424 and electrons 426 into the stream of metastable atoms 218. Additionally, some ground state atoms 208 are either not excited or are initially excited and decay back to the ground state.

In one embodiment, ions in the chamber 502 impact the more negatively biased electrode (either the first 524 or the second electrode 526) and generate secondary electrons (not shown) from that electrode. The magnetic fields 508a, 508b confine many of the electrons 426 and the secondary electrons in the chamber 502 thereby improving the efficiency of the excitation process in the chamber 502. The metastable atoms 218, ground state atoms 208, ions 424 and electrons 426 all pass through the output 532 of the chamber 502.

The electron/ion absorber 536 receives the metastable atoms 218, ground state atoms 208, ions 424 and electrons 426 through the input 534. The electron/ion absorber 536 traps the ions 424 and the electrons 426 and allows the metastable atoms 218 and the ground state atoms 208 to pass through an output 538. In one embodiment (not shown), depending on certain parameters, such as the flow rate of the ground state atoms 208 from the gas source, the strength of the magnetic fields 508a, 508b, and the strength of the electric field generated by the power supply 510, substantially all of the ions 424 and the electrons 426 can be absorbed in the chamber 502. In this embodiment, the electron/ion absorber 536 is not necessary.

Figure 7A:
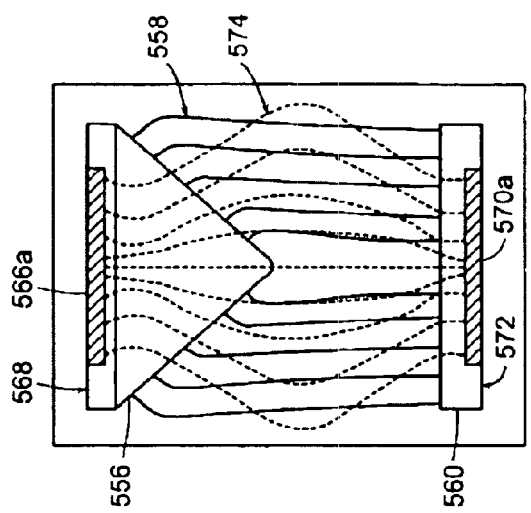
FIG. 7A illustrates a cross-sectional view of the metastable atom source of FIG. 7 that illustrates the magnetic field.
Figure 7:
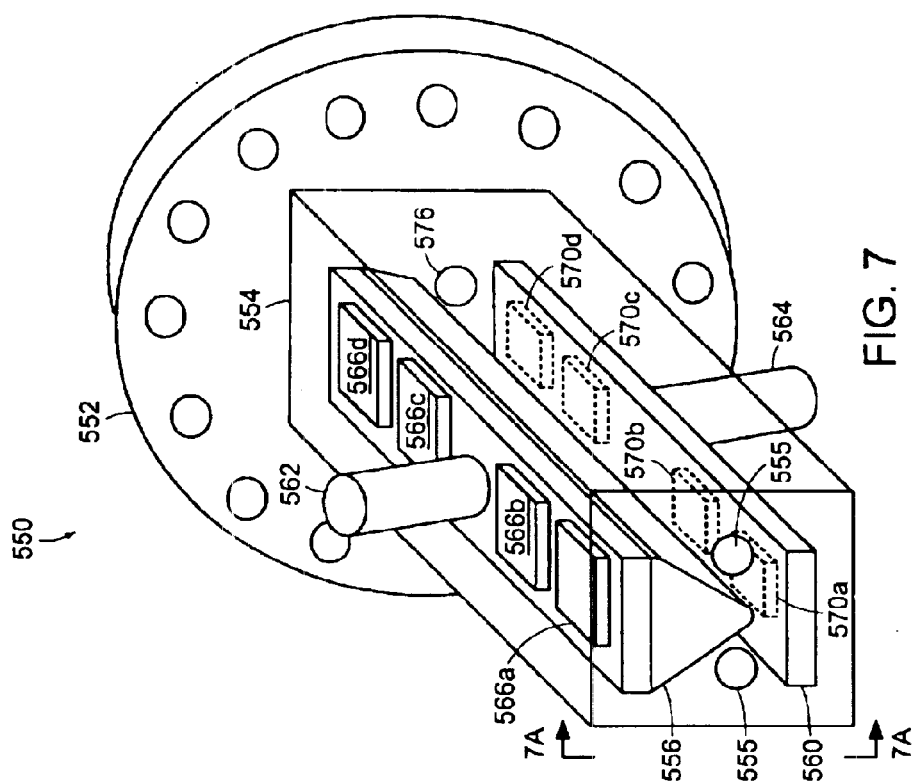
FIG. 7 is a perspective view of an excited atom source such as a metastable atom source according to one embodiment of the invention.

FIG. 7 is a perspective view of an excited atom source such as a metastable atom source 550 according to one embodiment of the invention. The metastable atom source 550 is shown coupled to a flange 552. The flange 552 is adapted to couple to an industry standard port (not shown) on a commercially available plasma chamber (not shown).

The metastable atom source 550 includes a chamber 554. Ground state atoms (not shown) enter the chamber 554 through one or more gas inputs 555. In one embodiment, the metastable atom source 550 includes a first electrode 556. The first electrode 556 can be a plate-type electrode, a cylindrical-shaped electrode, or a conical-shaped electrode as shown. The first electrode 556 can be any shape that produces an electric field 558 that excites ground state atoms to a metastable state.

A second electrode 560 is disposed inside the chamber 554 proximate to the first electrode 556. In one embodiment, the first electrode 556 is a cathode and the second electrode 560 is an anode. A first input terminal 562 couples the first electrode 556 to a power supply (not shown). A second input terminal 564 couples the second electrode 560 to the power supply.

In one embodiment, magnets 566a–d are positioned on the top surface 568 of the first electrode 556. In this embodiment, magnets 570a–d are also positioned in the bottom surface 572 of the second electrode 560 opposite to the magnets 566a–d. The magnets 566a–d trap electrons and increase the probability that electrons will collide with ground state atoms and generate metastable atoms. In one embodiment, the metastable atom source 550 includes at least one mirror (not shown) that is positioned so as to reflect light that is generated when excited and metastable atoms decay to the ground state.

FIG. 7A illustrates a cross-sectional view of the metastable atom source 550 of FIG. 7 illustrating the magnetic field 574. The magnets 566a–d, 570a–d create a magnetic field 574 that substantially traps and accelerates electrons (not shown) in the chamber 554. The trapped electrons (not shown) collide with the ground state atoms (not shown), thereby raising the energy of the ground state atoms to a metastable state. The metastable atoms (not shown) exit the chamber 554 through one or more gas outputs 576.

The operation of the metastable atom source 550 is similar to the operation of the metastable atom source 500 of FIG. 6. However, in this embodiment, the metastable atom source 550 does not include an electron/ion absorber 536. Thus, a small volume of ions and/or electrons that are not trapped by the magnetic field 574 will likely exit the chamber 554 of the metastable atom source 550 through the gas outputs 576.

Figure 8:
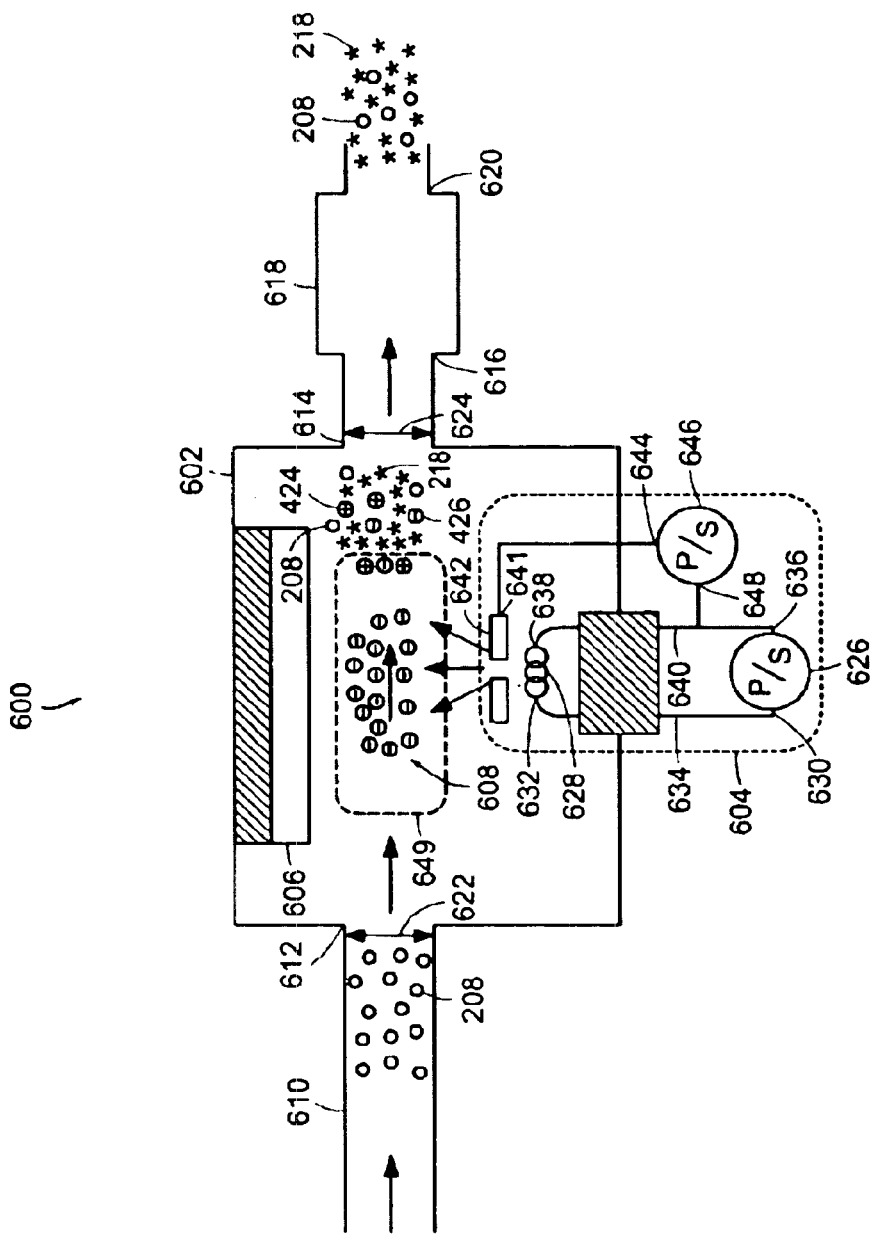
FIG. 8 illustrates a cross-sectional view of another embodiment of an excited atom source such as a metastable atom source according to the invention.

FIG. 8 illustrates a cross-sectional view of another embodiment of an excited atom source such as a metastable atom source 600 according to the invention. The metastable atom source 600 includes a chamber 602. The metastable atom source 600 also includes an electron gun 604 and an electron trap 606. The electron gun 604 includes a power supply 626 that is coupled to a filament electrode 628. The power supply 626 can be any type of power supply, such as a DC, an AC, a RF, or a pulsed power supply. A first output 630 of the power supply 626 is coupled to a first terminal 632 of the filament electrode 628 with a first transmission line 634. A second output 636 of the power supply 626 is coupled to a second terminal 638 of the filament electrode 628 with a second transmission line 640.

The electron gun 604 also includes an acceleration grid 642 that is adapted to accelerate the electrons 608 that are emitted by the filament electrode 628. An input 642 of the acceleration grid 642 is coupled to a first output 644 of a power supply 646. In one embodiment, the power supply 646 is a DC power supply or a pulsed power supply. The first output 644 of the power supply 646 couples a positive voltage to the input 642 of the acceleration grid 642. The positive voltage accelerates the negatively charged electrons towards the acceleration grid 642. In one embodiment, a second output 648 of the power supply 646 is coupled to the second input 636 of the power supply 636. However, many different power supply configurations are possible.

A gas line 610 is coupled to an input 612 of the chamber 602. An output 614 of the chamber 602 is coupled to an input 616 of an electron/ion absorber 618. In one embodiment, a diameter 622 of the input 612 of the chamber 602 and a diameter 624 of the output 614 of the chamber 602 are chosen to optimize the process of generating the metastable atoms 218.

In operation, ground state atoms 208 from the gas source (not shown) flow into the chamber 602 through the input 612. The ground state atoms 208 flow into a region 649 proximate to the electron gun 604. The electron gun 604 generates and accelerates electrons 608 into the region 649.

A portion of the ground state atoms 208 that are injected through the region 649 collide with the electrons 608 and are energized to a metastable state. Some of those ground state atoms 208 are energized to the point of ionization and release free ions 424 and electrons 426 into the stream of metastable atoms 218. Others of those ground state atoms 208 are energized to excited states other than a metastable state.

The electron trap 606 traps electrons 608 that are generated and accelerated by the electron gun 604. In one embodiment, the electron trap 606 is negatively biased. In this embodiment, ions 424 in the chamber 602 impact the surface of the electron trap 606 and generate secondary electrons from the surface of the electron trap 606. In another embodiment, the electron trap 606 is positively biased. In this embodiment, electrons 608 in the chamber 602 are further accelerated and trapped by the electron trap 606.

The metastable atoms 218, the ground state atoms 208, the ions 424 and electrons 426 then pass through the output 614 of the chamber 602. The electron/ion absorber 618 receives the metastable atoms 218, ground state atoms 208, ions 424 and electrons 426 through the input 616. The electron/ion absorber 618 traps the ions 424 and the electrons 426 and allows the metastable atoms 218 and the ground state atoms 208 to pass through the output 620.

Figure 9:
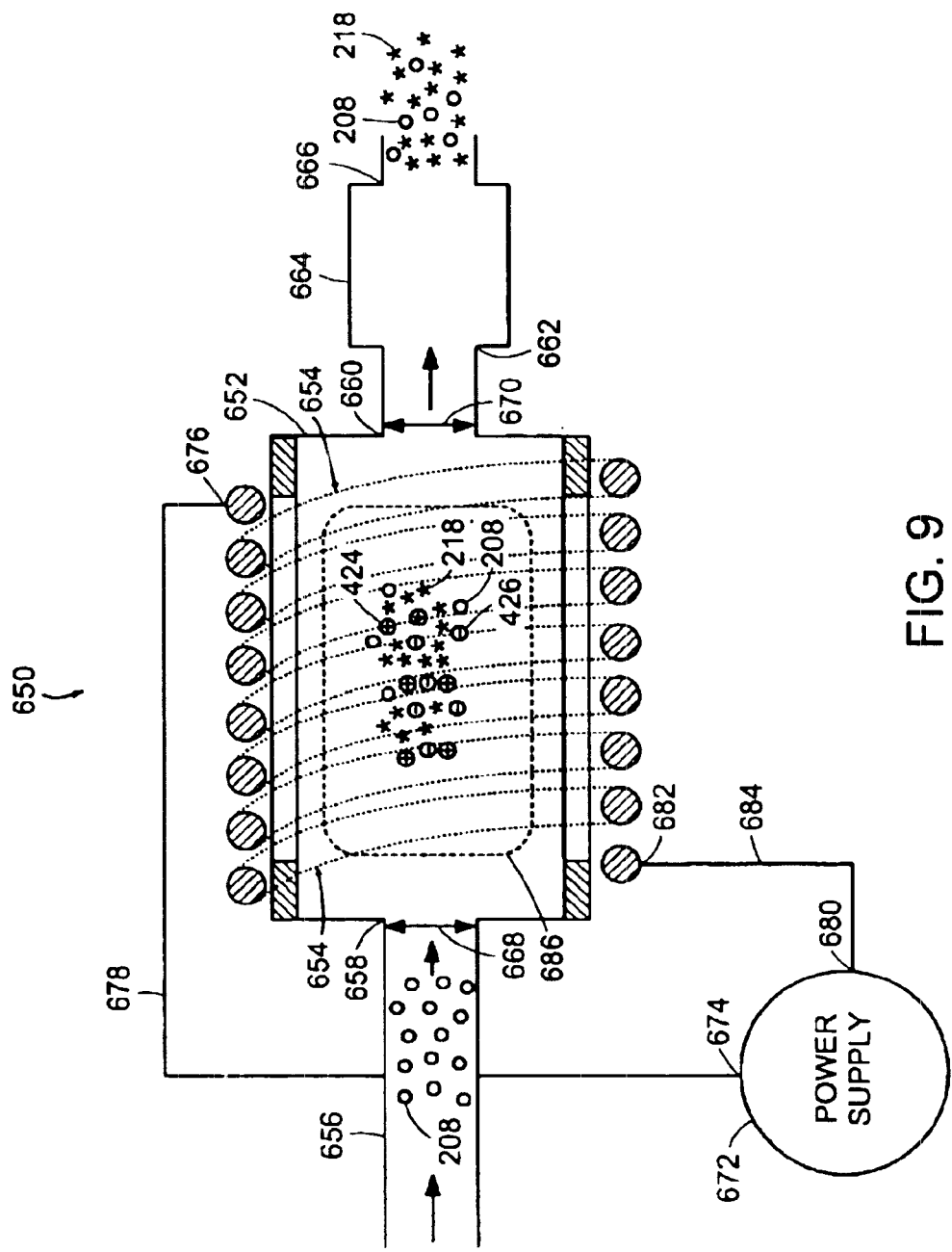
FIG. 9 illustrates a cross-sectional view of another metastable atom source according to the invention.

FIG. 9 illustrates a cross-sectional view of another metastable atom source 650 according to the invention. The metastable atom source 650 includes a chamber 652. In one embodiment, the chamber 652 is formed of a non-conducting pipe or a dielectric tube. The metastable atom source 650 also includes an inductive coil 654 that surrounds the chamber 652. The inductive coil 654 is adapted to inductively couple energy into the chamber 652.

A gas line 656 is coupled to an input 658 of the chamber 652. An output 660 of the chamber 652 is coupled to an input 662 of a electron/ion absorber 664. The metastable atoms 218 pass through an output 666 of the electron/ion absorber 664. In one embodiment, a diameter 668 of the input 658 of the chamber 652 and a diameter 670 of the output 660 of the chamber 652 are chosen to optimize the process of generating the metastable atoms 218.

The metastable atom source 650 includes a power supply 672. Any type of power supply can be used, such as a DC, an AC, a RF, or a pulsed power supply. A first output 674 of the power supply 672 is coupled to a first terminal 676 of the inductive coil 654 with a first transmission line 678. A second output 680 of the power supply 672 is coupled to a second terminal 682 of the inductive coil 654 with a second transmission line 684.

In operation, ground state atoms 208 from the gas source (not shown) flow into the chamber 652 through the input 658. The ground state atoms 208 flow into a region 686 and are surrounded by the inductive coil 654. The inductive coil 654 couples energy into the region 686 as current generated by the power supply 672 flows through the inductive coils. A portion of the ground state atoms 208 that are injected through the region 686 are energized to a metastable state. A portion of the ground state atoms 208 are ionized and release free ions 424 and electrons 426 into the stream of metastable atoms 218. Some ground state atoms 208 are also present in the stream of metastable atoms 218. The metastable atoms 218, the ground state atoms 208, the ions 424 and the electrons 426 then pass through the output 660 of the chamber 652. In some embodiments, excited atoms that are in excited states other than a metastable state can also be present in the stream of metastable atoms 218.

The electron/ion absorber 664 receives the metastable atoms 218, the ground state atoms 208, the ions 424 and the electrons 426 through the input 662. The electron/ion absorber 664 traps the ions 424 and the electrons 426 and allows the metastable atoms 218 and the ground state atoms 208 to pass through the output 666.

Figure 10:
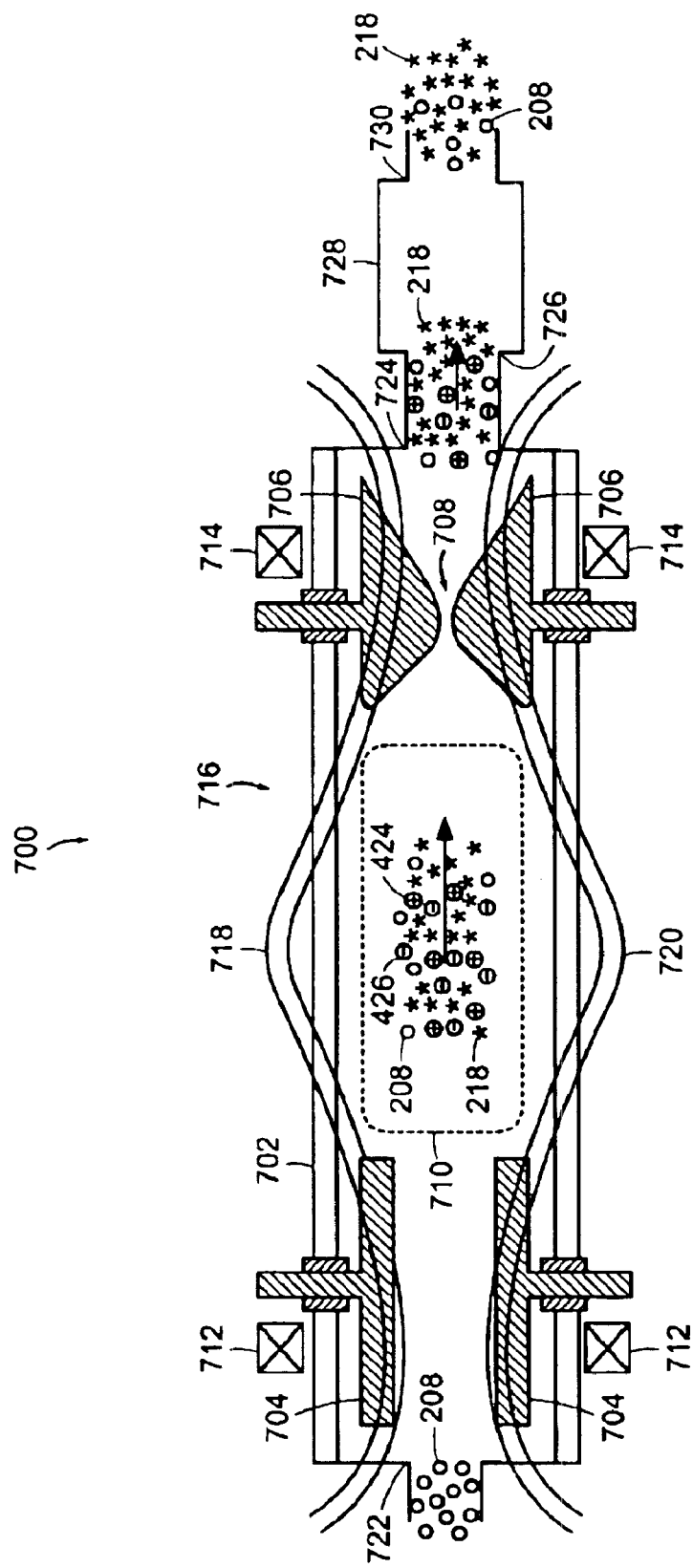
FIG. 10 illustrates a cross-sectional view of another metastable atom source according to the invention

FIG. 10 illustrates a cross-sectional view of another metastable atom source 700 according to the invention. This embodiment of the metastable atom source 700 includes a cylindrical chamber 702. In one embodiment, the cylindrical chamber. 702 is formed of a dielectric material or a non-conducting material. The metastable atom source 700 also includes a first cylindrical electrode 704 and a second cylindrical electrode 706. One of the first 704 and the second cylindrical electrodes 706 is adapted to be an anode and the other is adapted to be a cathode.

In one embodiment, the size and shape of the first 704 and the second electrodes 706 are chosen to optimize the process for generating metastable atoms 218 in the metastable atom source 700. For example, the shape of the second cylindrical electrodes 706 and the dimensions of a gap 708 can be chosen to control the pressure in a region 710 in the cylindrical chamber 702 so as to optimize the process of generating metastable atoms 218. For example, increasing the pressure in the region 710 can increase the efficiency of the excitation process and, therefore the efficiency of generating the metastable atoms.

A power supply (not shown) is electrically connected between the first 704 and the second cylindrical electrodes 706. In one embodiment, one terminal of the power supply is coupled to ground. In this embodiment, one of the first 704 and second cylindrical electrodes 706 is also coupled to ground (not shown).

In one embodiment, the metastable atom source 700 includes electromagnetic coils 712, 714. The electromagnetic coils 712, 714 generate a magnetic field 716 having magnetic field lines 718, 720. The magnetic field 716 traps electrons proximate to the region 710. The trapped electrons assist in trapping ions proximate to the region 710. In other embodiments, the metastable atom source 700 includes magnets (not shown).

A gas line (not shown) is coupled to an input 722 of the chamber 702. An output 724 of the chamber 702 is coupled to an input 726 of an electron/ion absorber 728.

The electron/ion absorber 728 passes the metastable atoms 218 through an output 730.

In operation, ground state atoms 208 from the gas source (not shown) flow into the chamber 702 through the input 722. The ground state atoms 208 then flow into the region 710. The power supply (not shown) generates a voltage between the first 704 and the second cylindrical electrodes 706. The voltage creates an electric field that raises the energy of the ground state atoms 208. A portion of the ground state atoms 208 that are injected through the region 710 are energized to a metastable state. A fraction of the ground state atoms 208 are ionized and release free ions 424 and electrons 426 into the stream of metastable atoms 218. A portion of the ground state atoms 208 in the region 710 can be excited to states other than a metastable state.

The metastable atoms 218, the ground state atoms 208, the ions 424 and electrons 426 then pass through the output 724 of the chamber 702. The electron/ion absorber 728 receives the metastable atoms 218, the ground state atoms 208, the ions 424 and the electrons 426 through the input 726. The electron/ion absorber 728 traps the ions 424 and the electrons 426 and allows the metastable atoms 218 and the ground state atoms 208 to pass through the output 730.

In other embodiments of the invention, the ground state atoms 208 are energized to a metastable state by using an energy source, such as a DC plasma source, a radio frequency (RF) plasma source, an ultraviolet (UV) radiation source, an X-ray radiation source, an electron beam radiation source, an ion beam radiation source, an inductively coupled plasma (ICP) source, a capacitively coupled plasma (CCP) source, a microwave plasma source, an electron cyclotron resonance (ECR) plasma source, a helicon plasma source, or a magnetron plasma discharge source.

Figure 11:
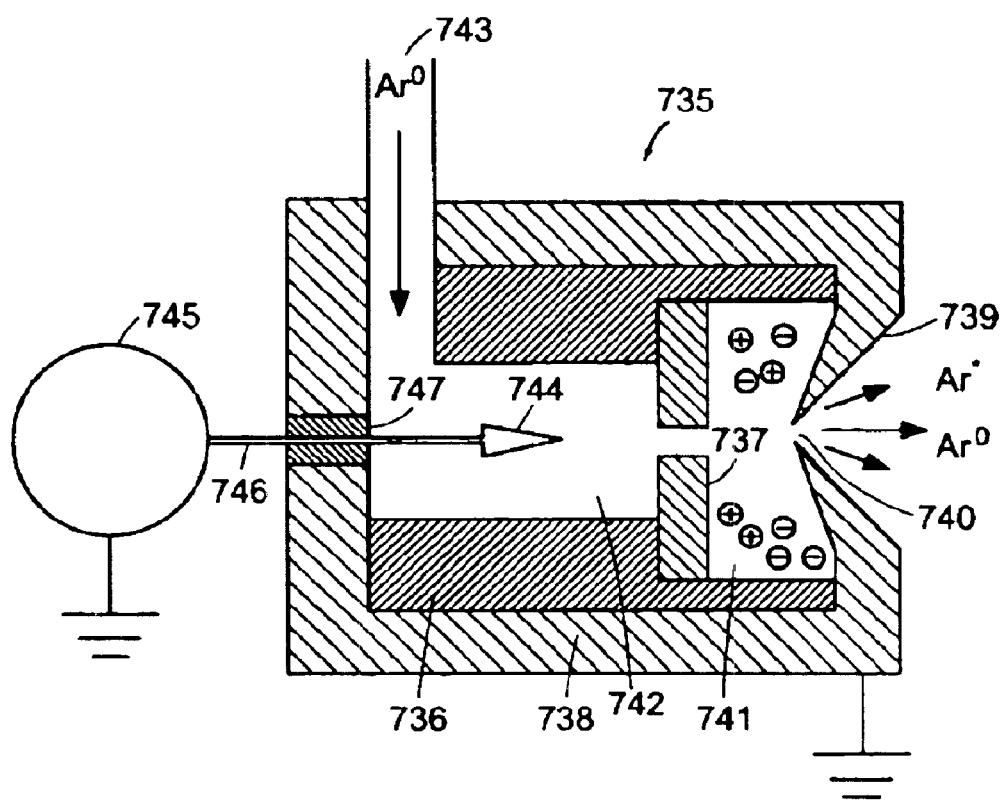
FIG. 11 illustrates a cross-sectional view of another metastable atom source according to the invention.

FIG. 11 illustrates a cross-sectional view of another metastable atom source 735 according to the invention. The metastable atom source 735 includes a tube 736. The tube 736 is formed of non-conducting material, such as dielectric material, like boron nitride or quartz. A nozzle 737 is positioned at one end of the tube 736. The tube 736 is surrounded by an enclosure 738. A skimmer 739 having an aperture 740 is positioned adjacent to the nozzle 737 forming a nozzle chamber 741. The skimmer 739 can be connected to the enclosure 738. In one embodiment, the skimmer 739 is cone-shaped as shown in FIG. 11. In one embodiment, the enclosure 738 and the skimmer 739 are electrically connected to ground potential.

The tube 736 and the enclosure 738 define an electrode chamber 742 that is in fluid communication with the a gas inlet 743. A feed gas source (not shown) is coupled to the gas inlet 743 so as to allow feed gas to flow into the electrode chamber 742. An electrode 744 is positioned inside the electrode chamber 742 adjacent to the nozzle 737 and to the skimmer 739. In one embodiment, the electrode 744 is a needle electrode, as shown in FIG. 11. The needle electrode will generate a relatively high electric field at the tip of the electrode. The electrode 744 is electrically isolated from the skimmer 739.

A power supply 745 is electrically coupled to the electrode 744 with a transmission line 746. The transmission line 746 may be fed into the electrode chamber 742 though an insulator 747. The power supply 745 can be any type of power supply suitable for plasma generation. such as a DC power supply, pulsed power supply. RF power supply, or an AC power supply. In one embodiment, the power supply 745 generates a constant power or a constant voltage.

In operation, feed gas flows into the electrode chamber 742 from the feed gas source. Some of the feed gas flows through the nozzle 737 into the nozzle chamber 741. In one embodiment, parameters such as the flow rate of the feed gas, the diameter of the nozzle 737, and the diameter of the skimmer aperture 740 are chosen to increase the generation of metastable atoms. The power supply 745 applies a voltage to the electrode 744. An electric field is developed between the electrode 744 and the skimmer 739. The electric field raises the energy of the volume of excited atoms thereby causing collisions between neutral atoms, electrons, and excited atoms. The collisions create excited atom and metastable atoms.

Figure 12A:
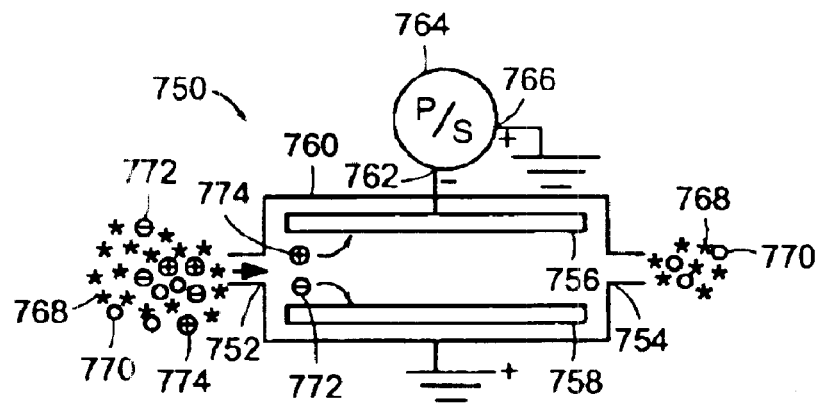
FIG. 12A through FIG. 12C illustrate various embodiments of electron/ion absorbers according to the invention.
Figure 12B:
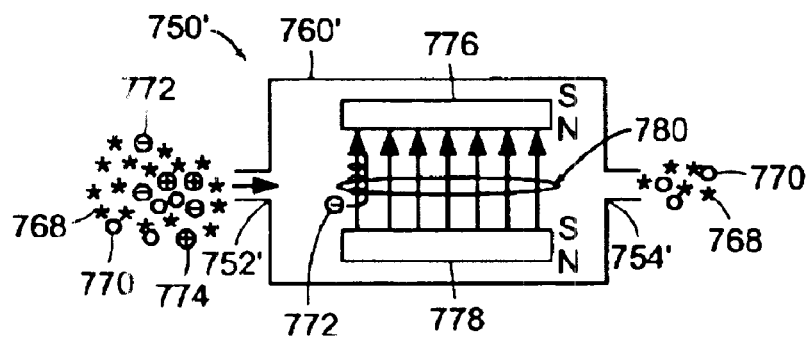
Figure 12C:
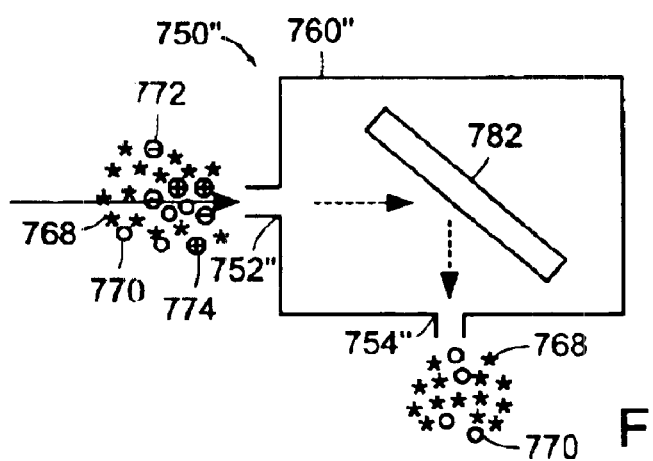

FIG. 12A through FIG. 12C illustrate various embodiments of electron/ion absorbers 750, 750', 750" according to the invention. Referring to FIG. 12A, the electron/ion absorber 750 includes a first 756 and a second electrode 758 that are positioned in a chamber 760. A first output 762 of a power supply 764 is coupled to the first electrode 756. A second output 766 of the power supply is coupled to ground. The second electrode 758 is also coupled to ground. In one embodiment, the power supply 764 is a DC power supply or a pulsed power supply.

In operation, metastable atoms 768, ground state atoms 770, electrons 772, and ions 774, flow through the input 752 of the electron/ion absorber 750 and enter the chamber 760. In one embodiment, the power supply 760 applies a negative potential to the first electrode 756 and, thus attracts and traps the ions 774 passing through the chamber 760. The second electrode 758 is positively biased and, thus attracts and traps the electrons 772. The metastable atoms 768 and the ground state atoms 770 flow through the output 754 of the electron/ion absorber 750.

FIG. 12B illustrates an electron/ion absorber 750' that includes a chamber 760'. First 776 and second magnets 778 are positioned inside the chamber 760'. The first 776 and the second magnets 778 generate a magnetic field 780 in the chamber 760' that traps the electrons and the ions. In operation, metastable atoms 768, ground state atoms 770, electrons 772, and ions 774 flow through the input 752' of the electron/ion absorber 750' and enter the chamber 760'. The electrons 772 are trapped by the magnetic field 780. The trapped electrons 772 then trap the ions 774 in the chamber 760'. The metastable atoms 768 and the ground state atoms 770 then flow through the output 754' of the electron/ion absorber 750'.

FIG. 12C illustrates an electron/ion absorber 750" that includes a chamber 760". An absorber 782 is disposed in the chamber 760" in the direction of electron and ion propagation. Any type of electron/ion absorber can be used. In operation, metastable atoms 768, ground state atoms 770, electrons 772, and ions 774, flow through the input 752" of the electron/ion absorber 750" and enter the chamber 760". The absorber 782 traps the electrons 772 and the ions 774 in the chamber 760". The metastable atoms 768 and the ground state atoms 770 flow through the output 754" of the electron/ion absorber 750".

Figure 13:
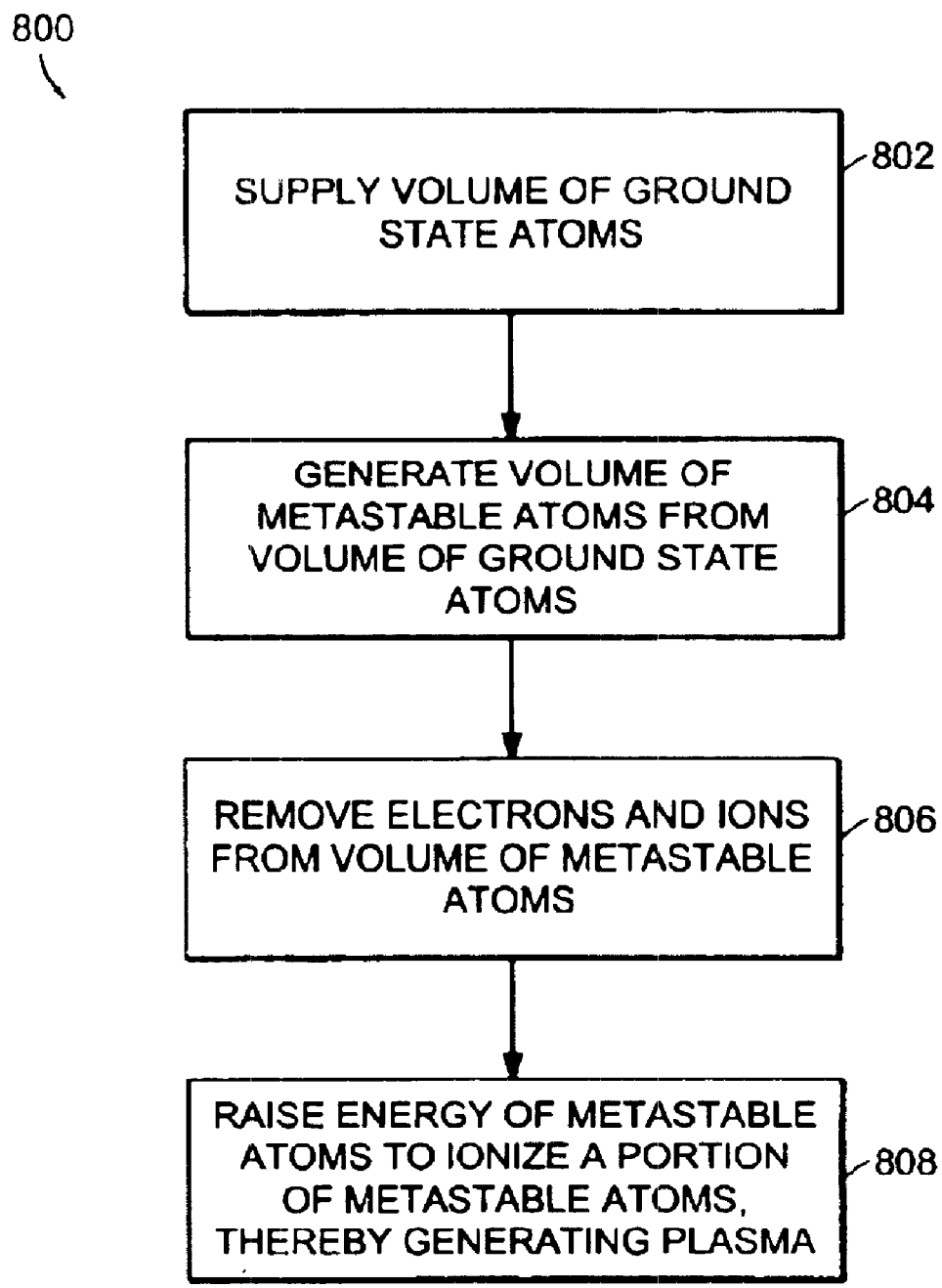
FIG. 13 is a flowchart of an illustrative process of generating a plasma with a multi-step ionization process according to the present invention.

FIG. 13 is a flowchart of an illustrative process 800 of generating a plasma with a multi-step ionization process according to the present invention. The process 800 includes flowing ground state atoms 208 from the gas source 206 (FIG. 2) into the metastable atom source 204 (step 802). In one embodiment, the volume of ground state atoms 208 includes a volume of noble gas atoms.

The metastable atom source 204 then generates a volume of metastable atoms 218 from the volume of ground state atoms 208 (step 804). In one embodiment, the volume of metastable atoms 218 is generated by generating a discharge that excites the ground state atoms 208 to a metastable state. In another embodiment, the volume of metastable atoms 218 is generated by generating an electron beam that excites the ground state atoms 208 to a metastable state. In another embodiment, the ground state atoms 208 are excited to an excited state other than a metastable state.

In one embodiment, a magnetic field is generated proximate to the ground state atoms 208. The magnetic field can be a static or a pulsed magnetic field. The magnetic field substantially traps electrons proximate to the ground state atoms 208 and, thus increases the excitation rate of the ground state atoms 208 to a metastable state.

In one embodiment, at least a portion of electrons and/or ions are removed from the volume of metastable atoms (step 806). Next, the energy of the metastable atoms 218 is raised so that at least a portion of the volume of metastable atoms 218 are ionized (step 808), thereby generating a plasma with a multi-step ionization process. The volume of metastable atoms 218 requires less energy to become ionized compared with a similar volume of ground state atoms 208.

In one embodiment, raising the energy of the metastable atoms 218 includes exposing the metastable atoms 218 to at least one of an electric field and a magnetic field. In another embodiment, raising the energy of the metastable atoms 218 includes exposing the metastable atoms 218 to an electron source, an X-ray radiation source, a plasma source.

While the invention has been particularly shown and described with reference to specific preferred embodiments, it should be understood by those skilled in the art that various changes in form and detail may be made therein without departing from the spirit and scope of the invention as defined herein.

What is claimed is:

1. A plasma generator that generates a plasma with a multi-step ionization process, the plasma generator comprising:
   a feed gas source comprising ground state atoms;
   an excited atom source that receives ground state atoms from the feed gas source, the excited atom source comprising a magnet that generates a magnetic field for substantially trapping electrons proximate to the ground state atoms, the excited atom source generating excited atoms from the ground state atoms;
   a plasma chamber that is coupled to the excited atom source, the plasma chamber confining a volume of excited atoms generated by the excited atom source; and
   an energy source that is coupled to the volume of excited atoms confined by the plasma chamber, the energy source raising an energy of excited atoms in the volume of excited atoms so that at least a portion of the excited atoms in the volume of excited atoms is ionized, thereby generating a plasma with a multi-step ionization process.

2. The plasma generator of claim 1 wherein the feed gas source comprises ground state atoms that are chosen from the group comprising noble gas atoms, a mixture of different noble gas atoms, reactive gas atoms, a mixture of different reactive gas atoms, and a mixture of noble and reactive gas atoms.

3. The plasma generator of claim 1 wherein the food gas source comprises a volume of ground state argon atoms.

4. The plasma generator of claim 1 wherein the excited atom source comprises a metastable atom source that generates metastable atoms from the ground state atoms.

5. The plasma generator of claim 1 wherein the excited atom source comprises a first electrode and a second electrode, the first electrode and the second electrode generating a discharge that excites the ground state atoms.

6. The plasma generator of claim 1 wherein the magnetic field that substantially traps electrons proximate to the ground state atoms increases at least one of a rate at which the excited atoms are generated from the ground state atoms and a density of excited atoms.

7. The plasma generator of claim 1 wherein the excited atom source comprises an electron gun that directs an electron beam into the ground state atoms, the electron beam exciting the ground state atoms.

8. The plasma generator of claim 1 wherein a pressure differential exists between a pressure in the excited atom source and a pressure in the plasma chamber, the pressure differential increasing at least one of a rate at which the excited atoms are generated from the ground state atoms and a density of the excited atoms.

9. The plasma generator of claim 1 wherein the excited atom source comprises an inductively coupled discharge source that generates a discharge that excites ground state atoms.

10. The plasma generator of claim 1 wherein the excited atom source is positioned inside the plasma chamber.

11. The plasma generator of claim 1 wherein the excited atom source is positioned outside the plasma chamber.

12. The plasma generator of claim 1 wherein the excited atoms generated by the excited atom source have a lower ionization energy compared with an ionization energy of the ground state atoms.

13. The plasma generator of claim 1 wherein the energy source is chosen from the group comprising a DC discharge source, a radio frequency (RF) source, an X-ray source, an electron beam source, an ion beam source, an inductively coupled plasma (ICP) source, a capacitively coupled plasma (CCP) source, a microwave plasma source, an electron cyclotron resonance (ECR) plasma source, a helicon plasma source, a magnetron source, and an AC discharge source.

14. The plasma generator of claim 1 wherein the energy source comprises a power supply.

15. The plasma generator of claim 14 wherein the power supply is chosen from the group comprising a pulsed (DC) power supply, a RF power supply, an AC power supply, and a DC power supply.

16. The plasma generator of claim 1 further comprising an electron/ion absorber that receives the excited atoms from the excited atom source, the electron/ion absorber trapping electrons and ions.

17. The plasma generator of claim 1 wherein the plasma that is generated with the multi-step ionization process has a higher plasma density than a plasma that is generated by direct ionization of the ground state atoms.

18. A plasma generator that generates a plasma with a multi-step ionization process, the plasma generator comprising:
   a feed gas source comprising ground state atoms;
   a metastable atom source that receives ground state atoms from the feed gas source, the metastable atom source comprising a magnet that generates a magnetic field for substantially trapping electrons proximate to the ground state atoms, the metastable atom source generating metastable atoms from the ground state atoms;
   a plasma chamber that is coupled to the metastable atom source, the plasma chamber confining a volume of metastable atoms generated by the metastable atom source; and
   a power supply that is electrically coupled to the volume of metastable atoms confined by the plasma chamber, the power supply generating a power that raises an energy of metastable atoms in the volume of metastable atoms so that at least a portion of the metastable atoms in the volume of metastable atoms is ionized, thereby generating a plasma with a multi-step ionization process.

19. The plasma generator of claim 18 wherein the metastable atom source comprises a first electrode and a second electrode, the first electrode and the second electrode generating a discharge that excites the ground state atoms to a metastable state.

20. The plasma generator of claim 18 wherein the metastable atom source comprises an electron gun that directs an electron beam into the ground state atoms, the electron beam exciting the ground state atoms to a metastable state.

21. The plasma generator of claim 18 wherein the metastable atom source comprises an inductively coupled discharge source that generates a discharge that excites the ground state atoms.

22. The plasma generator of claim 18 wherein the magnetic field that substantially traps electrons proximate to the ground state atoms increases at least one of a rate at which the metastable atoms are generated from the ground state atoms and a density of the metastable atoms.

23. The plasma generator of claim 18 wherein a pressure differential exists between a pressure in the metastable atom source and a pressure in the plasma chamber, the pressure differential increasing at least one of a rate at which the metastable atoms are generated from the ground state atoms and a density of the metastable atoms.

24. The plasma generator of claim 18 wherein the metastable atom source is positioned inside the plasma chamber.

25. The plasma generator of claim 18 wherein the metastable atom source is positioned outside the plasma chamber.

26. The plasma generator of claim 18 wherein the metastable atoms generated by the metastable atom source have a lower ionization energy compared with an ionization energy of the ground state atoms.

27. The plasma generator of claim 18 wherein the power supply is chosen from the group comprising a pulsed (DC) power supply, a RF power supply, an AC power supply, and a DC power supply.

28. The plasma generator of claim 18 further comprising an electron/ion absorber that receives the metastable atoms from the metastable atom source, the electron/ion absorber trapping electrons and ions.

29. The plasma generator of claim 18 wherein the plasma that is generated with the multi-step ionization process has a higher plasma density than a plasma that is generated by direct ionization of the ground state atoms.

30. A method for generating a plasma with a multi-step ionization process, the method comprising:
   generating a magnetic field proximate to a volume of ground state atoms to substantially trap electrons proximate to the volume of ground state atoms;
   generating a volume of metastable atoms from the volume of ground state atoms; and
   raising an energy of the metastable atoms so that at least a portion of the volume of metastable atoms is ionized, thereby generating a plasma with a multi-step ionization process.

31. The method of claim 30 wherein the volume of ground state atoms comprises a volume of noble gas atoms.

32. The method of claim 30 wherein the generating the volume of metastable atoms comprises generating a discharge that excites at least a portion of the ground state atoms in the volume of ground state atoms to a metastable state.

33. The method of claim 30 wherein the generating the magnetic field proximate to the volume of ground state atoms increases excitation of at least a portion of the ground state atoms in the volume of ground state atoms to a metastable state.

34. The method of claim 30 wherein the generating the volume of metastable atoms comprises generating an electron beam that excites at least a portion of the ground state atoms in the volume of ground state atoms to a metastable state.

35. The method of claim 30 wherein the raising the energy of the metastable atoms comprises exposing the metastable atoms to an electric field.

36. The method of claim 30 wherein the raising the energy of the metastable atoms comprises exposing the metastable atoms to X-ray radiation.

37. The method of claim 30 wherein the raising the energy of the metastable atoms comprises exposing the metastable atoms to a plasma.

38. The method of claim 30 further comprising trapping electrons and ions in the volume of metastable atoms.

39. The method of claim 30 wherein the raising the energy of the metastable atoms comprises exposing the metastable atoms to an electron source.

40. A method for generating a plasma with a multi-step ionization process, the method comprising:
   generating a magnetic field proximate to a volume of ground state molecules to substantially trap electrons proximate to the volume of ground state molecules;
   generating a volume of metastable molecules from the volume of ground state molecules; and
   raising an energy of the metastable molecules so that at least a portion of the volume of metastable molecules is ionized, thereby generating a plasma with a multi-step ionization process.

41. An apparatus for generating a plasma comprising:
   means for generating a magnetic field proximate to a volume of ground state atoms to substantially trap electrons proximate to the volume of ground state atoms;
   means for generating a volume of metastable atoms from the volume of ground state atoms; and
   means for raising an energy of the metastable atoms so that at least a portion of the volume of metastable atoms is ionized, thereby generating a plasma with a multi-step ionization process.

42. The apparatus of claim 41 further comprising means for trapping electrons and ions in the volume of metastable atoms.

43. A plasma generator that generates a plasma with a multi-step ionization process, the plasma generator comprising:
   a feed gas source comprising ground state atoms;
   an excited atom source that is coupled to the feed gas source, the excited atom source generating excited atoms from the ground state atoms;
   a plasma chamber that is coupled to the excited atom source, the plasma chamber confining a volume of excited atoms generated by the excited atom source, wherein a pressure differential exists between a pressure in the excited atom source and a pressure in the plasma chamber, the pressure differential increasing at least one of a rate at which the excited atoms are generated from the ground state atoms and a density of the excited atoms; and
   an energy source that is coupled to the volume of excited atoms confined by the plasma chamber, the energy source raising an energy of excited atoms in the volume of excited atoms so that at least a portion of the excited atoms in the volume of excited atoms is ionized, thereby generating a plasma with a multi-step ionization process.

44. A plasma generator that generates a plasma with a multi-step ionization process, the plasma generator comprising:
   a feed gas source comprising ground state atoms;
   an inductively coupled discharge source that is coupled to the feed gas source, the inductively coupled discharge source generating excited atoms from the ground state atoms;
   a plasma chamber that is coupled to the inductively coupled discharge source, the plasma chamber confining a volume of excited atoms generated by the inductively coupled discharge source; and
   an energy source that is coupled to the volume of excited atoms confined by the plasma chamber, the energy source raising an energy of excited atoms in the volume of excited atoms so that at least a portion of the excited atoms in the volume of excited atoms is ionized, thereby generating a plasma with a multi-step ionization process.

45. A plasma generator that generates a plasma with a multi-step ionization process, the plasma generator comprising:

a feed gas source comprising ground state atoms;

an excited atom source that is coupled to the feed gas source, the excited atom source generating excited atoms from the ground state atoms;

an electron/ion absorber that receives the excited atoms generated by the excited atom source and then traps elections and ions;

a plasma chamber that is coupled to the electron/ion absorber, the plasma chamber confining a volume of excited atoms generated by the excited atom source; and an energy source that is coupled to the volume of excited atoms confined by the plasma chamber, the energy source raising an energy of excited atoms in the volume of excited atoms so that at least a portion of the excited atoms in the volume of excited atoms is ionized, thereby generating a plasma with a multi-step ionization process.

46. A method for generating a plasma with a multi-step ionization process, the method comprising:

generating a volume of metastable atoms from a volume of ground state atoms;

trapping electrons and ions in the volume of metastable atoms; and raising an energy of the metastable atoms so that at least a portion of the volume of metastable atoms is ionized, thereby generating a plasma with a multi-step ionization process.

* * * * *

UNITED STATES PATENT AND TRADEMARK OFFICE
CERTIFICATE OF CORRECTION

PATENT NO. : 6,805,779 B2
DATED : October 19, 2004
INVENTOR(S) : Roman Chistyakov It is certified that error appears in the above-identified patent and that said Letters Patent is hereby corrected as shown below:

Column 21,
Line 36, replace "food" with -- feed --

Column 25,
Line 10, replace "elections" with -- electrons --

Signed and Sealed this

Nineteenth Day of April, 2005

JON W. DUDAS
*Director of the United States Patent and Trademark Office*